(12) United States Patent
Urano et al.

(10) Patent No.: US 9,437,581 B2
(45) Date of Patent: Sep. 6, 2016

(54) LED MODULE

(71) Applicant: PANASONIC INTELLECTUAL PROPERTY MANAGEMENT CO., LTD., Osaka (JP)

(72) Inventors: Yoji Urano, Osaka (JP); Akifumi Nakamura, Osaka (JP); Hayato Ioka, Osaka (JP); Ryoji Imai, Osaka (JP); Jun Goda, Osaka (JP); Toru Hirano, Osaka (JP); Masanori Suzuki, Osaka (JP); Hideaki Hyuga, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/404,092

(22) PCT Filed: May 24, 2013

(86) PCT No.: PCT/JP2013/003303
§ 371 (c)(1),
(2) Date: Nov. 26, 2014

(87) PCT Pub. No.: WO2013/179626
PCT Pub. Date: Dec. 5, 2013

(65) Prior Publication Data
US 2015/0108510 A1    Apr. 23, 2015

(30) Foreign Application Priority Data
May 31, 2012    (JP) ................................ 2012-125017

(51) Int. Cl.
*H01L 33/00*    (2010.01)
*H01L 25/075*    (2006.01)
(Continued)

(52) U.S. Cl.
CPC ......... *H01L 25/0753* (2013.01); *H01L 33/486* (2013.01); *H01L 33/50* (2013.01);
(Continued)

(58) Field of Classification Search
CPC ... H01L 33/60; H01L 33/62; H01L 25/0753; H01L 25/075; H01L 33/507
USPC ........................................................... 257/88
See application file for complete search history.

(56) References Cited

U.S. PATENT DOCUMENTS

| 7,341,878 B2 * | 3/2008 | Krames ................. B82Y 30/00 |
| | | 257/E21.379 |
| 2009/0121253 A1 | 5/2009 | Abe |
| 2011/0260646 A1 * | 10/2011 | Moon ................. H01L 25/0753 |
| | | 315/294 |
| 2012/0112215 A1 | 5/2012 | Chai et al. |
| 2013/0334559 A1 * | 12/2013 | Vdovin et al. .................. 257/98 |
| 2015/0048402 A1 | 2/2015 | Urano et al. |

FOREIGN PATENT DOCUMENTS

| JP | 2001-284656 | 10/2001 | |
| JP | 2005-209958 | * 8/2005 | ............. H01L 33/00 |

(Continued)

OTHER PUBLICATIONS

U.S. Appl. No. 14/387,312 to Yoji Urano et al., filed Sep. 23, 2014.
(Continued)

*Primary Examiner* — Tuan Nguyen
(74) *Attorney, Agent, or Firm* — Greenblum & Bernstein, P.L.C.

(57) ABSTRACT

The LED module includes: a light diffusing substrate having light transmissive properties; an LED chip bonded to a first surface of the light diffusing substrate with a transparent first bond in between; a color converter facing the first surface to cover the LED chip; and a mounting substrate. The color converter is made of transparent material containing phosphor which, when excited by light emitted from the LED chip, emits light having a different color from the LED chip. The mounting substrate includes a diffuse reflection layer diffusely reflecting light emitted from the LED chip and light emitted from the phosphor. The diffuse reflection layer is placed facing a second surface of the light diffusing substrate.

4 Claims, 19 Drawing Sheets

(51) Int. Cl.
  *H01L 33/48* (2010.01)
  *H01L 33/50* (2010.01)
  *H01L 33/60* (2010.01)
  *H01L 33/54* (2010.01)
  *H01L 33/62* (2010.01)
  *F21K 99/00* (2016.01)
  *F21S 8/02* (2006.01)
  *F21Y 101/02* (2006.01)

(52) U.S. Cl.
  CPC ............ *H01L 33/507* (2013.01); *H01L 33/54* (2013.01); *H01L 33/60* (2013.01); *H01L 33/62* (2013.01); *F21K 9/17* (2013.01); *F21S 8/02* (2013.01); *F21Y 2101/02* (2013.01); *H01L 2224/45144* (2013.01); *H01L 2224/48091* (2013.01); *H01L 2224/73265* (2013.01); *H01L 2933/0091* (2013.01)

(56) References Cited

FOREIGN PATENT DOCUMENTS

| | | | | |
|---|---|---|---|---|
| JP | 2007-059781 | | 3/2007 | |
| JP | 2007-109701 | | 4/2007 | |
| JP | 2007-287713 | | 11/2007 | |
| JP | 2008-028181 | | 2/2008 | |
| JP | 2008-251663 | | 10/2008 | |
| JP | 2009-123908 | * | 6/2009 | ............ H01L 33/00 |
| JP | 2011-086419 | * | 4/2011 | ............ H01L 33/58 |

OTHER PUBLICATIONS

U.S. Appl. No. 14/387,703 to Yoji Urano et al., filed Sep. 24, 2014.
Search report from PCT/JP2013/003303, mail date is Jun. 18, 2013.
Search report from E.P.O., mail date is Apr. 24, 2015.

* cited by examiner

LED MODULE

TECHNICAL FIELD

The present invention relates to LED modules.

BACKGROUND ART

In the past, there has been proposed a light emitting device with a structure shown in FIG. 27 as a light emitting device required to emit white light (JP 2007-109701 A: patent document 1). This light emitting device includes a metal plate 203 having functions of heat dissipation and light reflection, a wiring board 201 including a through hole 207 allowing passage of light, and a bonding sheet 202 bonding the wiring board 201 and the metal plate 203. Further, in this light emitting device, a light emitting element 214 constituted by an LED chip is mounted on a part of the metal plate 203 exposed via the through hole 207 of the wiring board 201, and the light emitting element 214 is bonded to a land 206 on an upper surface of the wiring board 201 in a wire bonding manner by use of metal wires 215.

It is disclosed that the metal plate 203 of the aforementioned light emitting device may be an aluminum plate.

With regard to the light emitting device with the structure shown in FIG. 27, it is considered that some of rays of light emitted from the light emitting layer of the light emitting element 214 pass through the light emitting element 214 and then are reflected by the metal plate 203. However, regarding this light emitting device, it is considered that the light-outcoupling efficiency tends to decrease due to absorption and/or multiple reflection of rays of light totally reflected by the metal plate 203 in the light emitting element 214.

SUMMARY OF INVENTION

In view of the above insufficiency, the present invention has aimed to propose an LED module with an improved light-outcoupling efficiency.

The LED module of an aspect of the present invention includes: a light diffusing substrate having light-transmissive properties; at least one LED chip bonded to a first surface of the light diffusing substrate with a transparent first bond in between; a color converter facing the first surface to cover the at least one LED chip: and a mounting substrate. The color converter is made of transparent material containing phosphor which, when excited by light emitted from the at least one LED chip, emits light having a different color from the at least one LED chip. The mounting substrate includes a diffuse reflection layer diffusely reflecting light emitted from the at least one LED chip and light emitted from the phosphor. The diffuse reflection layer is placed facing a second surface of the light diffusing substrate.

In a preferable aspect of this LED module, the at least one LED chip includes a face in a thickness direction and a first electrode and a second electrode which are connected to the face. The mounting substrate includes a patterned wiring conductor electrically connected to the first electrode and the second electrode of the at least one LED chip through respective wires, and a resin part placed facing a rear face of the patterned wiring conductor. The patterned wiring conductor is opaque. The resin part has electrically-insulating properties. The diffuse reflection layer is formed facing a front face of the patterned wiring conductor. The diffuse reflection layer includes through holes allowing passage of respective second ends of the wires having first ends respectively bonded to the first electrode and the second electrode.

In a preferable aspect of this LED module, the at least one LED chip includes a face in a thickness direction and a first electrode and a second electrode which are connected to the face. The mounting substrate includes a patterned wiring conductor electrically connected to the first electrode and the second electrode of the at least one LED chip through respective wires, and a resin part placed facing a rear face of the patterned wiring conductor. The patterned wiring conductor is opaque. The resin part has electrically-insulating properties. The diffuse reflection layer is formed facing the second surface of the light-diffusing substrate, and an opposite side of the diffuse reflection layer from the light-diffusing substrate is bonded to a front face of the patterned wiring conductor by a transparent second bond.

Accordingly, the LED module in accordance with the present invention includes the light-diffusing substrate with light-transmissive properties and the diffuse reflection layer diffusely reflecting light emitted from the LED chip and light emitted from the phosphor, and thus can have an improved light-outcoupling efficiency.

DESCRIPTION OF EMBODIMENTS (Embodiment 1)

Figure 1A:
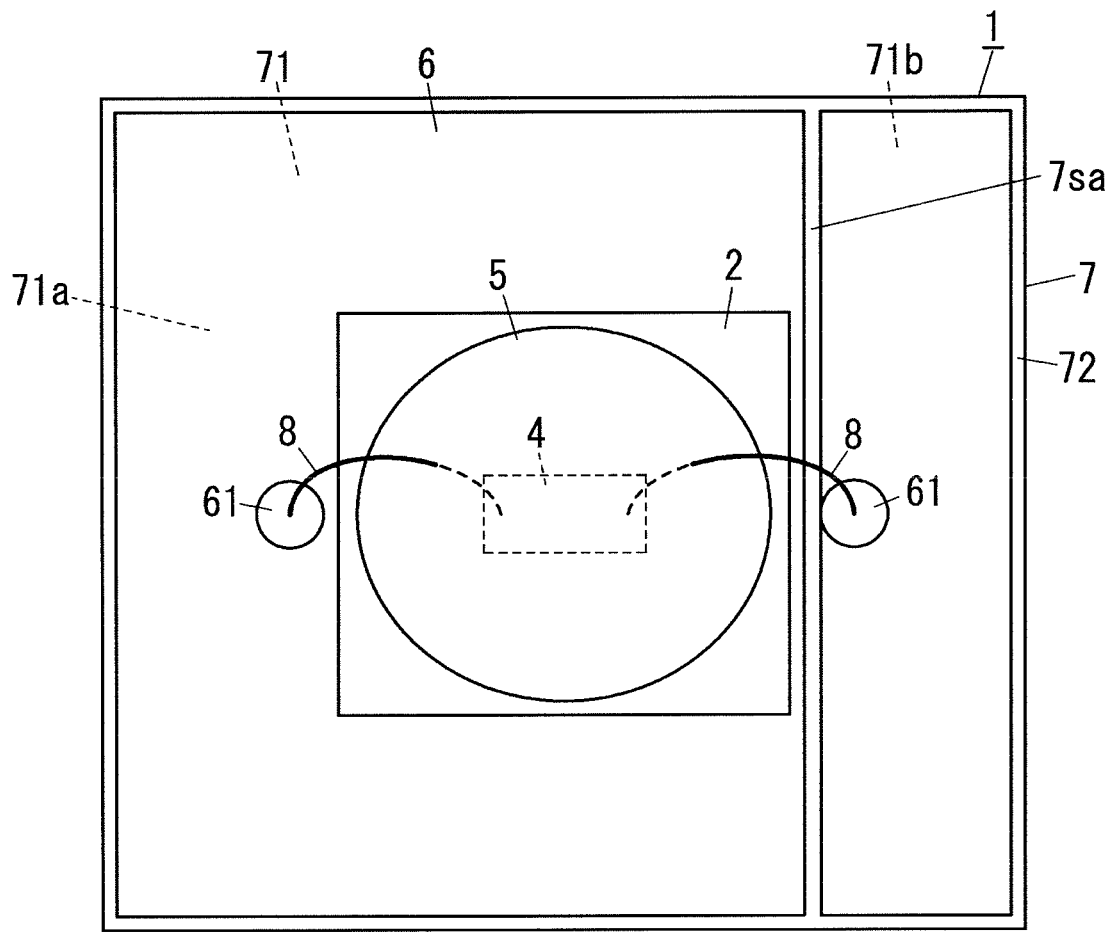
FIG. 1A is a schematic plan view illustrating an LED module of the embodiment 1.
Figure 1B:
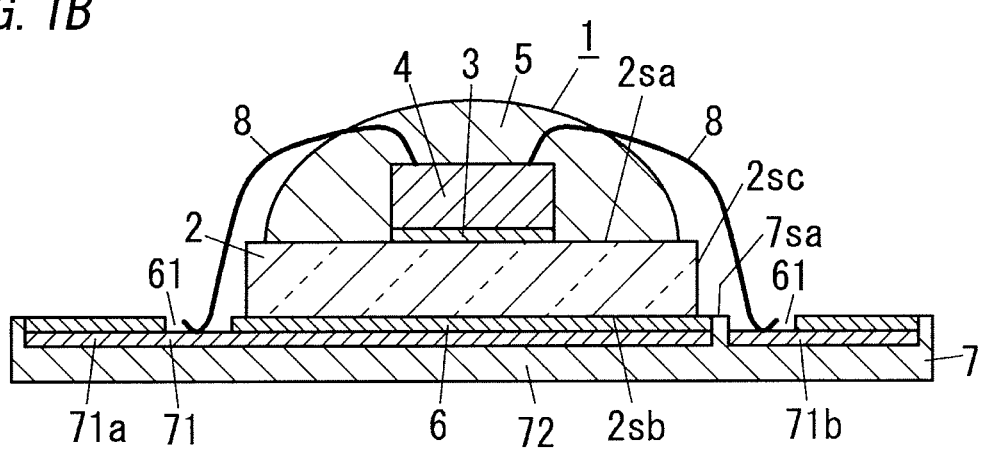
FIG. 1B is a schematic sectional view illustrating the LED module of the embodiment 1.

Hereinafter, an LED module 1 of the present embodiment is described with reference to FIGS. 1A and 1B.

The LED module 1 includes: a light-diffusing substrate 2 having light-transmissive properties; an LED chip 4 bonded to a first surface 2sa of the light-diffusing substrate 2 with a transparent first bond 3 in-between; and a color converter 5 facing the first surface 2sa to cover the LED chip 4. The color converter 5 is made of transparent material containing phosphor which, when excited by light emitted from the LED chip 4, emits light having a different color from the LED chip 4. Further, the LED module 1 includes a mounting substrate 7. The mounting substrate 7 includes a diffuse reflection layer 6 diffusely reflecting light emitted from the LED chip 4 and light emitted from the phosphor. The diffuse reflection layer 6 is placed facing a second surface 2sb of the light-diffusing substrate 2.

Therefore, in the LED module 1, some of rays of light which is emitted from a light emitting layer 43 of the LED chip 4 (see FIGS. 2A and 2B) and passes through the LED chip 4 and the first bond 3 are diffused by the light-diffusing substrate 2, and emerge outside through a side face 2sc of the light-diffusing substrate 2. Accordingly, the LED module 1 includes the light-diffusing substrate 2 with light-transmissive properties, and the diffuse reflection layer 6 placed facing the second surface 2ab of the light-diffusing substrate 2 so as to diffusely reflect light emitted from the LED chip 4 and light emitted from the phosphor, and thereby can have an improved light-outcoupling efficiency.

Hereinafter, components of the LED module 1 are described in more detail.

The LED chip 4 includes a face in a thickness direction of the LED chip 4 and a first electrode (not shown) serving as an anode electrode and a second electrode (not shown) serving as a cathode electrode which are connected to the face.

Figure 2A:
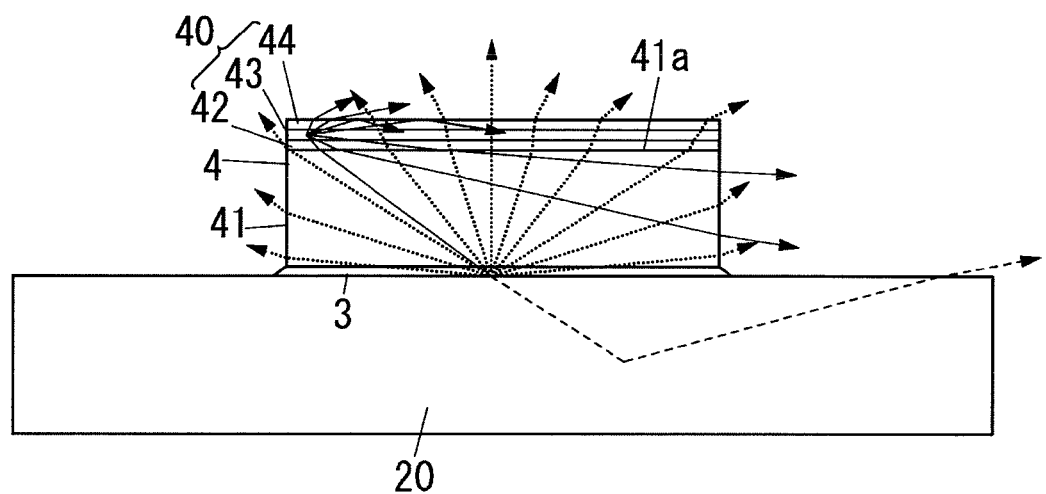
FIGS. 2A and 2B are explanatory views illustrating paths of light rays with regard to a structure of a reference example 1.
Figure 2B:
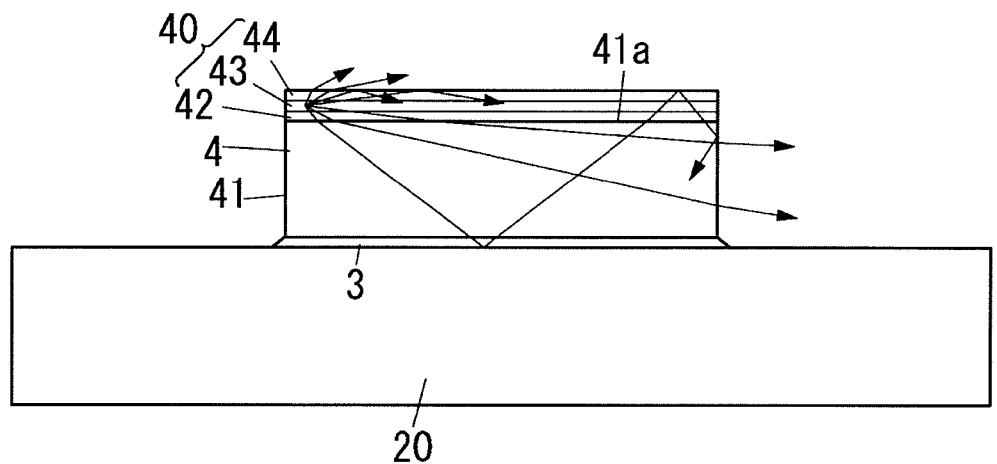

As shown in FIGS. 2A and 2B, the LED chip 4 includes a substrate 41 with a main surface 41a and an LED structure 40 on the main surface 41a. The LED structure 40 includes an n-type semiconductor layer 42, the light emitting layer 43, and a p-type semiconductor layer 44. The stacking order of the n-type semiconductor layer 42, the light emitting layer 43, and the p-type semiconductor layer 44 is the n-type semiconductor layer 42, the light emitting layer 43, and the p-type semiconductor layer 44, from the substrate 41. The stacking order is not limited thereto, however, and the stacking order may be the p-type semiconductor layer 44, the light emitting layer 43, and the n-type semiconductor layer 42. It is more preferable that the LED chip 4 include a buffer layer between the LED structure 40 and the substrate 41. It is preferable that the light emitting layer 43 have a single quantum well structure or a multiple quantum well structure, but is not limited to having such a structure. For example, the LED chip 4 may have a doublehetero structure constituted by the n-type semiconductor layer 42, the light emitting layer 43, and the p-type semiconductor layer 44. Note that, the structure of the LED chip 4 is not particularly limited. In a case where the LED module 1 includes the LED chip 4 which is an LED chip with a structure a reflection layer (e.g., a reflection member such as Bragg reflector) is incorporated, use of the light-diffusing substrate 2 and the diffuse reflection layer 6 can cause a more improvement of the light-output efficiency than use of an LED chip including a reflection layer inside.

The LED chip 4 may be a GaN-based blue LED chip which emits blue light, for example. In this case, the LED chip 4 includes a sapphire substrate serving as the substrate 41. Note that, the substrate 41 of the LED chip 4 is not limited to the sapphire substrate, and the substrate 41 may be a substrate transparent for light emitted from the light emitting layer 43.

The chip size of the LED chip 4 is not particularly limited. For example, the LED chip 4 may have a chip size of 0.3 mm□ (0.3 mm by 0.3 mm), 0.45 mm□ (0.45 mm by 0.45 mm), and 1 mm□ (1 mm by 1 mm). Further, the planar shape of the LED chip 4 is not limited to a square shape, and, for example, may be a rectangular shape. When the planar shape of the LED chip 4 is a rectangular shape, the chip size of the LED chip 4 may be 0.5 mm by 0.24 mm.

Further, with regard to the LED chip 4, the material and the emission color of the light emitting layer 43 are not particularly limited. For example, the LED chip 4 is not limited to a blue LED chip, and may be a violet LED chip, an ultraviolet LED chip, a red LED chip, or a green LED chip.

The first bond 3 bonding the LED chip 4 and the light-diffusing substrate 2 may be made of silicone resin, epoxy resin, or a hybrid material composed of silicone resin and epoxy resin.

The light-diffusing substrate 2 may be made of translucent ceramics (e.g., alumina and barium sulfate), for example. Transmittance, reflectance, and thermal conductivity of the translucent ceramics can be adjusted by changing types and concentration of a binder, an additive, and the like. In the LED module 1, the LED chip 4 is bonded to a center of the first surface 2sa of the light-diffusing substrate 2 by the first bond 3 which is transparent. Therefore, in the LED module 1, light emitted from the light emitting layer 43 of the LED chip 4 toward a further face of the LED chip 4 in the thickness direction easily emerges outside through the side face of the LED chip 4, and additionally is diffused inside the light-diffusing substrate 2 and thus easily emerges outside through a peripheral part of the first surface 2sa of the light-diffusing substrate 2. Consequently, the light-outcoupling efficiency of the LED module 1 can be improved.

The light-diffusing substrate 2 is formed into a rectangular plate shape. However, the shape of the light-diffusing substrate 2 is not limited thereto and may be a circular shape or a polygonal shape. The light-diffusing substrate 2 is formed to have a planar size greater than a planar size of the LED chip 4. Hence, the light-outcoupling efficiency of the LED module 1 can be improved.

It is preferable that the light-diffusing substrate 2 be designed to have a close linear expansion coefficient to the LED chip 4 so as to provide a stress alleviation function of alleviating stress potentially acting on the LED chip 4 which would otherwise be caused by a difference between linear expansion coefficients of the LED chip 4 and the mounting substrate 7. Accordingly, in the LED module 1, it is possible to reduce stress acting on the LED chip 4 which would otherwise be caused by the difference between the linear expansion coefficients of the LED chip 4 and the mounting substrate 7.

Further, it is preferable that the light-diffusing substrate 2 have a heat conduction function of conducting heat which is generated in the LED chip 4 toward the mounting substrate 7. Also, it is preferable that the light-diffusing substrate 2 have a heat conduction function of conducting heat which is generated in the LED chip 4 to a region which is larger than the chip size of the LED chip 4. Accordingly, in the LED module 1, heat generated in the LED chip 4 can be efficiently dissipated via the light-diffusing substrate 2 and the mounting substrate 7.

The shape of the color converter 5 may be appropriately selected based on the planar shape of the LED chip 4. For example, when the planar shape of the LED chip 4 is a rectangular shape, it is preferable that the color converter 5 have a semiellipsoidal shape and be placed so that a major axis and a minor axis of the color converter 5 in a plan view are respectively parallel to a lengthwise direction and a width direction of the LED chip 4 in a plan view. Alternatively, when the planar shape of the LED chip 4 is a square shape, it is preferable that the color converter 5 have a hemispherical shape. However, the shape of the color converter 5 is not particularly limited and may be appropriately selected according to desired light distribution properties of the LED module 1. The color converter 5 covers the LED chip 4 and additionally parts of wires 8 connected to the LED chip 4. The color converter 5 is in contact with the face and a side face of the LED chip 4 and a peripheral part of the first surface 2sa of the light-diffusing substrate 2. For example, the color converter 5 can be formed by molding.

Transparent material used as material of the color converter 5 is silicone resin. The transparent material is not limited to silicon resin and may be epoxy resin, acrylic resin, glass, or organic/inorganic hybrid material in which an organic component and an inorganic component are mixed and/or combined at a nanometer (nm) level or molecular level.

Phosphor used as material of the color converter 5 functions as wavelength conversion material which converts light emitted from the LED chip 4 to light with a longer wavelength than the light emitted from the LED chip 4. Hence, the LED module 1 can emit light with a mixed color of light emitted from the LED chip 4 and light emitted from the phosphor.

In the LED module 1, for example, when the LED chip 4 is a blue LED chip, and the phosphor of the wavelength conversion material is yellow phosphor, white light can be realized. In other words, in the LED module 1, blue light emitted from the LED chip 4 and yellow light emitted from the yellow phosphor emerge outside through the surface of the color converter 5, and thereby white light can be realized.

The fluorescent material serving as the wavelength conversion material is not limited to the yellow fluorescent material, and may include, for example, a set of a yellow fluorescent material and a red fluorescent material, or a set of a red fluorescent material and a green fluorescent material. Also, the fluorescent material serving as the wavelength conversion material is not limited to one kind of yellow fluorescent material, and may include two kinds of yellow fluorescent materials having different emission peak wavelengths. The color rendering property of the LED module 1 can be improved by use of a plurality of fluorescent materials as the wavelength conversion material.

The mounting substrate 7 preferably includes: a patterned wiring conductor 71 which is opaque and is electrically connected to the LED chip 4; and the resin part 72 placed to face a rear surface of the patterned wiring conductor 71. The resin part 72 has electrically insulating properties. The patterned wiring conductor 71 which is provided as a wiring part defines a patterned conductor for supply of electricity to the LED chip 4. The patterned conductor means a conduction part which is patterned to have a desired shape.

In the mounting substrate 7, the diffuse reflection layer 6 is formed to face the main surface of the patterned wiring conductor 71. The diffuse reflection layer 6 includes through holes 61 allowing passage of respective second ends of the wires 8 having first ends respectively bonded to the first electrode and the second electrode of the LED chip 4.

For example, material of the patterned wiring conductor 71 may be selected from aluminum, an aluminum alloy, silver, copper, phosphor bronze, a copper alloy (e.g., an 42 alloy), or a nickel alloy. For example, the patterned wiring conductor 71 can be formed by use of a lead frame, metal foil, or metal film. The lead frame is a metal frame and is formed of elongated metal hoop. It is preferable that the metal hoop have a thickness in a range of 100 μm to 1500 μm, for example.

The lead frame may include on its main surface a surface treatment layer which is higher in reflectance for light from the LED chip 4 than the metal hoop. The surface treatment layer may be an Ag film, a stack film constituted by an Ni film, a Pd film, and an Au film, a stack film constituted by an Ni film and an Au film, or a stack film of an Ag film, a Pd film, and an Au—Ag alloy film, for example. In view of long-term reliability (e.g., oxidation resistance, corrosion resistance, adhesiveness to the resin part 72), the surface treatment layer may be made of a stack film constituted by an Ni film, a Pd film, and an Au film, a stack film constituted by an Ni film and an Au film, or a stack film of an Ag film, a Pd film, and an Au—Ag alloy film is preferable to the surface treatment layer made of an Ag film. Preferably, the surface treatment layer may be constituted by a plating layer. In summary, the surface treatment layer is preferably formed by plating. The surface treatment layer may be formed on not only the main surface but also the whole of the lead frame. Alternatively, the surface treatment layer may be formed partially on the main surface of the lead frame by spot plating or the like.

Note that, the metal hoop may be made of highly reflective substrate which includes: an aluminum plate as a base material; an aluminum film which is formed on a surface of the aluminum substrate and is made of aluminum with a higher purity than the aluminum plate; and reflection enhancement film constituted by two types of dielectric films with different refractive indices. In this regard, it is preferable that the two types of dielectric films are $SiO_2$ film and a $TiO_2$ film, for example. The highly reflective substrate may be MIRO2 or MIRO (registered trademark) available from alanod company, for example. The aforementioned aluminum plate may have a surface subjected to anodization. When the aforementioned highly reflective substrate is used as the metal hoop, it is necessary to form conductive film for making electrical connection with the wires 8 by plating, or to pattern the reflection enhancement film.

The patterned wiring conductor 71 includes a first conductive part (first patterned conductor) 71a electrically connected to one of the first electrode and the second electrode of the LED chip 4 through the wire 8, and a second conductive part (second patterned conductor) 71b electrically connected to the other of the first electrode and the second electrode through the other wire 8. Note that, in the example of FIG. 1, the first electrode is electrically connected to the first patterned conductor 71a via the wire 8, and the second electrode is electrically connected to the second conductive part 71b via the other wire 8.

In the mounting substrate 7, it is preferable that a surface treatment layer having an outermost layer of Au be formed on part of the main surface of the patterned wiring conductor 71 which is not covered with the diffuse reflection layer 6. This surface treatment layer may be made of material which is higher in oxidation resistance and corrosion resistance than the material of the patterned wiring conductor 71. In a case where the patterned wiring conductor 71 is formed by use of the aforementioned lead frame and the material of the patterned wiring conductor 71 is Cu, it is preferable that the surface treatment layer be a stack film constituted by an Ni film, a Pd film, and an Au film or a stack film constituted by an Ni film and an Au film. In this case, the surface treatment film can have high oxidation resistance and high corrosion resistance, and bond strength between the surface treatment film and a gold wire serving as the wire 8 can be improved. Additionally, it is possible to prevent dispersion of Cu which is material of the patterned wiring conductor 71 into the Au film of the surface treatment layer.

One example of a method of forming the mounting substrate 7 includes steps of preparing first a lead frame including the patterned wiring conductor 71; forming the diffuse reflection layer 6 on the patterned wiring conductor 71; forming the surface treatment layer by electrolytic plating; forming by insert molding the resin part 72 where the patterned wiring conductor 71 is embedded; and removing undesired part from the lead frame by cutting. In the method of forming the mounting substrate 7, the diffuse reflection layer 6 is formed before the surface treatment layer is formed by electrolytic plating. Thereby, in contrast to a case where the diffuse reflection layer 6 is not formed before the surface treatment layer is formed, an amount of the plating formed on the patterned wiring conductor 71 can be reduced, and thus production cost can be lowered. The aforementioned method of forming the mounting substrate 7 is merely one example, and another method of forming can be used.

The planar shape of the mounting substrate 7 is a rectangular shape. In contrast, in the patterned wiring conductor 71, the first conductive part 71a and the second conductive part 71b are arranged in a predetermined direction (left and right direction in FIG. 1A) side by side, and an imaginary quadrangle including both the first conductive part 71a and the second conductive part 71b is a rectangular smaller than a peripheral shape of the resin part 72 and similar to the peripheral shape. In this regard, a size of an outer shape of the patterned wiring conductor 71 is determined so that the first conductive part 71a and the second conductive part 71b occupy most of the above imaginary quadrangle. In more detail, the peripheral shape of the first conductive part 71a is a rectangular shape, and a length of the first conductive part 71a in the predetermined direction is shorter than three-fourths of a length of a side of the imaginary quadrangle in the predetermined direction, and a length of the first conductive part 71a in a direction perpendicular to the predetermined direction is equal to a length of a side of the imaginary quadrangle in a direction perpendicular to the predetermined direction. Further, a length of the second conductive part 71b in the predetermined direction is shorter than one-fourth of the length of the side of the imaginary quadrangle in the predetermined direction, and a length of the second conductive part 71b in a direction perpendicular to the predetermined direction is equal to the length of the side of the imaginary quadrangle in the direction perpendicular to the predetermined direction. In the mounting substrate 7, shapes and sizes of the first conductive part 71a and the second conductive part 71b are not limited particularly. However, it is preferable that the patterned wiring conductor 71 be designed to cover most of a surface of the resin part 72 close to the light-diffusing substrate 2. In this case, the heat dissipation properties of the LED module 1 can be improved. In the patterned wiring conductor 71, the second conductive part 71b may be larger than the first conductive part 71a. Further, in the patterned wiring conductor 71, the sizes of the outer shapes of the first conductive part 71a and the second conductive part 71b are selected so that the light-diffusing substrate 2 is included within either a projection of the first conductive part 71a in a thickness direction of the patterned wiring conductor 71 or a projection of the second conductive part 71b in the thickness direction. In summary, in the patterned wiring conductor 71, the sizes of the outer shapes of the first conductive part 71a and the second conductive part 71b are selected so that the light-diffusing substrate 2 is included within either a vertical projection of the first conductive part 71a or a vertical projection of the second conductive part 71b.

The planar shape of the mounting substrate 7 is not limited to a rectangular shape and may be other shape such as a circular shape, an ellipsoidal shape, a triangular shape, a polygonal shape other than a rectangular shape, for example.

Material of the diffuse reflection layer 6 may be pure white resist (resin). The material of the diffuse reflection layer 6 is preferably white resist and pure white resist is more preferable in white resist. When the LED module 1 includes the diffuse reflection layer 6 with pure white color, light emitted from the LED chip 4 and light emitted from the phosphor can be diffusely reflected by the surface of the diffuse reflection layer 6 efficiently. In the LED module 1, the planar size of the mounting substrate 7 is larger than a planar size of the light-diffusing substrate 2, and nevertheless light emitted from the LED chip 4 and light emitted from the phosphor are diffusely reflected by the surface of the diffuse reflection layer 6 and thus can be prevented from being absorbed by the mounting substrate 7. Therefore, the light-outcoupling efficiency of the LED module 1 can be improved. Further, the LED module 1 includes the light-diffusing substrate 2, and thus the diffuse reflection layer 6 beneath the light-diffusing substrate 2 is not exposed to air. Therefore, deterioration with age of the diffuse reflection layer 6 is likely to be suppressed, and thus unwanted effects caused by the deterioration with age can be reduced.

The diffuse reflection layer 6 is formed to cover most of the patterned wiring conductor 71 in a plan view. This diffuse reflection layer 6 is patterned to include the through holes 61 close to the light-diffusing substrate 2 and opening parts (not shown) at a peripheral part of the mounting substrate 7. One of the through holes 61 exposes one part of the first conductive part 71a and the other of the through holes 61 exposes one part of the second conductive part 71b. One of the opening parts exposes one part of the first conductive part 71a, and the other of the opening parts exposes one part of the second conductive part 71b. Hence, parts of the first conductive part 71a and the second conductive part 71b which are exposed near the light-diffusing substrate 2 serve as connection parts to be connected to the wires 8, and other parts of the first conductive part 71a and the second conductive part 71b which are exposed at the peripheral part of the mounting substrate 7 serve as connection parts for external connection.

The resin part 72 may be made of material prepared by mixing resin with filler with higher thermal conductivity than the resin. In this case, with regard to the mounting substrate 7, the resin part 72 can have lower thermal resistance than the resin part 72 which is made of resin in which filler is not mixed. The resin for the resin part 72 may be vinylester resin or unsaturated polyester resin, for example. The filler may be of magnesium oxide, boron nitride, aluminum hydroxide, or glass fiber, for example. Further, the filling rate of the filler may be preferably in a range of 60% by volume to 75% by volume. In this case, in the mounting substrate 7, the resin part 72 can have thermal conductivity in a range of about 4 W/mK to 10 W/mK. In one example of the resin part 72 of the mounting substrate 7, the resin is vinylester resin, and the filler is of magnesium oxide, and the filling rate of the filler is 67% by volume. In this case, the resin part 72 can have thermal conductivity of 5 W/mK, and linear expansion coefficient of about 18 to 22 ppm/K. Aluminum has thermal conductivity of about 23 ppm/K and copper has thermal conductivity of about 17 ppm/K.

The number of LED chips 4 placed on the first surface 7sa of the mounting substrate 7 is not limited to one, but may be two or more. When the number of LED chips 4 is two or more, the number of LED chips 4 may be equal to the number of light-diffusing substrates 2, or the number of light-diffusing substrates 2 may be smaller than the number of LED chips 4. In brief, for example, the LED module 1 may include a plurality of structures each in which one LED chip 4 is bonded to one light-diffusing substrate 2 by one first bond 3, or another structure in which a plurality of LED chips 4 are bonded to one light-diffusing substrate 2 via individual first bonds 3.

Further, in the LED module 1, for example, the mounting substrate 7 may have an elongated planar shape, and two or more LED chips 4 are arranged in a lengthwise direction of the mounting substrate 7. In this case, the patterned wiring conductor 71 is formed so as to allow series connection, parallel connection, or series-parallel connection of two or more LED chips 4.

The wire 8 is not limited to the gold wire, and may be an aluminum wire, for example.

The opening shape of the through hole 61 is a circular shape. The inner diameter of the through hole 61 is set to 0.5 mm, but this is merely example, and is not limited particularly. The shape of the through hole 61 is not limited to a circular shape, and may be a rectangular shape or an ellipsoidal shape. In a plan view, the through holes 61 are formed in both sides of the LED chip 4 one by one.

The light-diffusing substrate 2 and the mounting substrate 7 are bonded to each other by a transparent second bond (not shown). The second bond may be made of silicone resin or epoxy resin, for example.

It is preferable that the LED module 1 include a cover part (not shown) which is made of transparent material and covers the color converter 5 and parts of the wires 8 which are not covered with the color converter 5 above the first surface 7sa of the mounting substrate 7. The cover part may be made of the same transparent material as the color converter 5. In summary, the material of the cover part may be epoxy resin, acrylic resin, glass, or organic/inorganic hybrid material in which an organic component and an inorganic component are mixed and/or combined at a nanometer (nm) level or molecular level. Note that, it is preferable that a light exit surface of the cover part may have a similar shape of a light exit surface of the color converter 5. Further, in a process of forming the LED module 1, after the color converter 5 is formed, the through holes 61 are filled with the material of the cover part with a dispenser so as to prevent contact of the wires 8 with the light-diffusing substrate 2, and thereafter the cover part may be formed.

To solve the problem of improving the light-outcoupling efficiency, the present inventors studied hard a submount member 20 (see FIGS. 2A, 2B, 3A to 3D, and 7 to 9) on which the LED chip 4 is mounted and a support member 170 (FIGS. 7 to 9) placed on an opposite side of the submount member 20 from the LED chip 4.

First, with regard to a structure (reference example 1) in which the LED chip 4 is mounted on the submount member 20 by bonding the LED chip 4 to the submount member 20 with the first bond 3, the present inventors examined differences between light-outcoupling efficiencies caused by differences of materials of the submount member 20. The LED chip 4 was a GaN based blue LED chip in which the substrate 41 was of sapphire and light emitted from the light emitting layer 43 was blue. Further, the submount member 20 was selected from a translucent ceramic substrate (translucent alumina substrate), and metal plates (an Ag substrate and an Al substrate) with higher reflectivity than the translucent ceramic substrate. Further, the material of the first bond 3 was silicone resin.

FIG. 2A relates to a structure of the reference example 1 in which the submount member 20 is the translucent ceramic substrate, and shows arrows which schematically illustrate paths of rays of light emitted from an arbitrarily selected point of the light emitting layer 43. Further, FIG. 2B relates to another structure of the reference example 1 in which the submount member 20 is the Ag substrate, and shows arrows which schematically illustrate paths of rays of light emitted from an arbitrarily selected point of the light emitting layer 43. With regard to the structures of the reference example 1, the light-outcoupling efficiency of the case where the submount member 20 was the translucent ceramic substrate was higher by 8 to 10% than the light-outcoupling efficiency of the case where the submount member 20 was the Ag substrate.

With regard to the structures of the reference example 1, structural parameters shown in FIGS. 3A to 3D were used. With regard to the LED chip 4, the planar shape is rectangular, and the length H41 of the long side was 0.5 mm and the length H42 of the short side was 0.24 mm. Further, with regard to the LED chip 4, the total thickness t4 of the substrate 41 and the LED structure 40 was 0.14 mm, and the thickness t5 of the LED structure 40 is 0.0004 mm, and the thickness t6 defined by a distance from the face of the LED chip 4 to the light emitting layer 43 was 0.0003 mm. Further, with regard to the LED chip 4, the substrate 41 was made of sapphire with a refractive index of 1.77, and the LED structure 40 was made of GaN with a refractive index of 2.5.

Further, with regard to the light emitting layer 43, it is assumed that rays of light with same intensity are radiated isotropically from every point of the light emitting layer 43.

Further, the first bond 3 has a thickness t3 of 0.005 mm and is made of silicone resin with a refractive index of 1.41.

With regard to the submount member 20, the lengths H1 and H2 of adjacent two sides were 3.75 mm and 3.75 mm, respectively. Accordingly, the distance L1 between the LED chip 4 and the periphery of the submount member 20 in a direction along the lengthwise direction of the LED chip 4 was 1.625 mm, and the distance L2 between the LED chip 4 and the periphery of the submount member 20 in a direction along the width direction of the LED chip 4 was 1.755 mm.

Figure 3A:
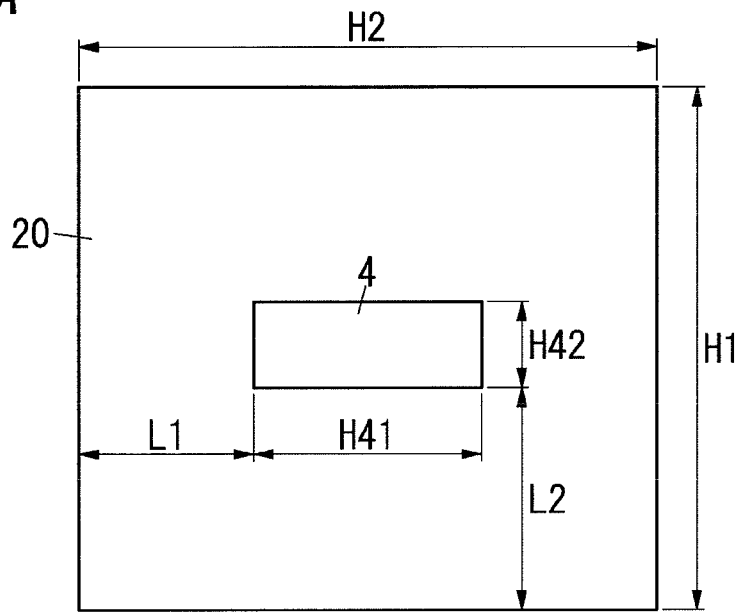
FIGS. 3A to 3D are explanatory views illustrating structural parameters of the structure of the reference example 1.
Figure 3B:
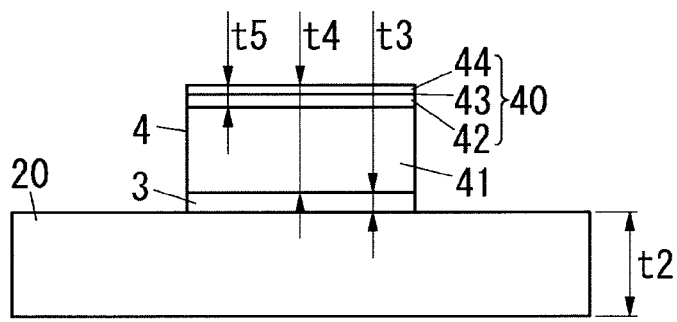
Figure 3C:
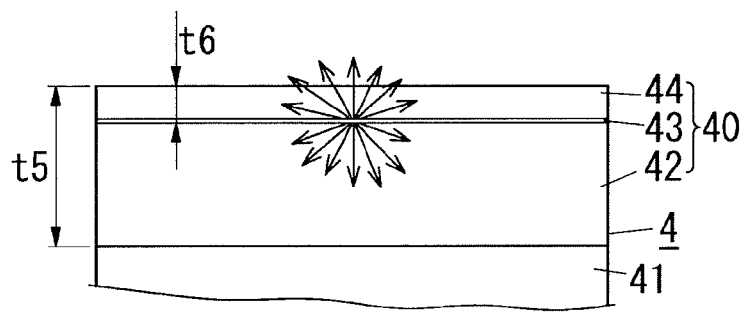
Figure 3D:
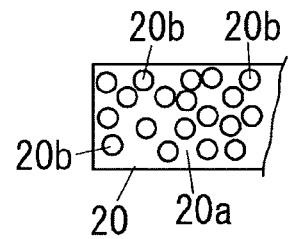

Further, with regard to the optical properties of the submount member 20, in the case of the translucent ceramic substrate, it was assumed that the reflectance was 92% and the transmittance was 8%. With regard to the case where the submount member 20 was the translucent ceramic substrate, the present inventors considered a structural model in which spherical particles were contained in a base material of ceramics and the spherical particles had a different refractive index from the base material as shown in FIG. 3D. To obtain the aforementioned values of the reflectance and the transmittance, it was assumed that the refractive index of the base material was 1.77, the refractive index of the particles was 1.0, the particle diameter was 3.0 μm, and the particle concentration was 16.5%.

Further, it was assumed that total luminous flux radiated from the structure of the reference example 1 was detected by a far field photoreceiver which was considered as being placed infinite distance from the structure of the reference example.

With regard to actual measured values of the light-outcoupling efficiency, the light-outcoupling efficiency of the case where the submount member 20 was the translucent ceramic substrate in the structure of the reference example 1 was 72.5%, whereas, the light-outcoupling efficiency of the case where the submount member 20 was the Al substrate in the structure of the reference example 1 was 68.7%.

Figure 4:
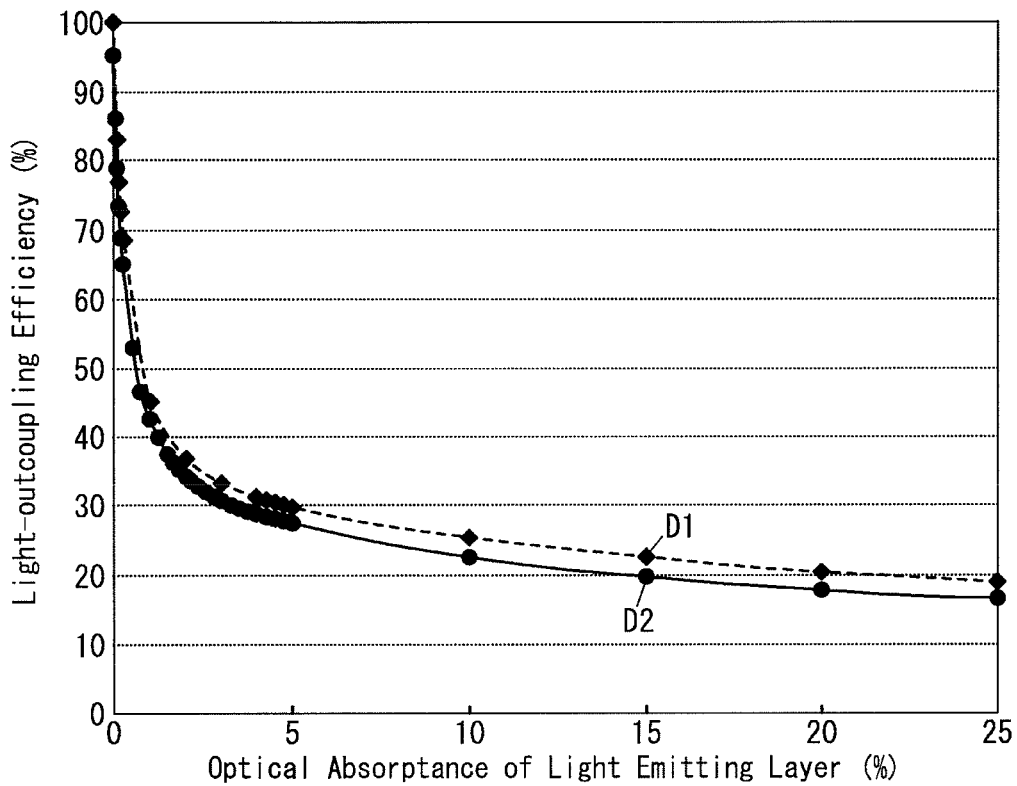
FIG. 4 is a diagram illustrating a result of simulation of a relationship between an absorptance and a light-outcoupling efficiency of a light emitting layer of an LED chip regarding the structure of the reference example 1.

FIG. 4 shows a result of simulation of a relationship between absorptance of the light emitting layer 43 and the light-outcoupling efficiency of the whole structure of the reference example 1. FIG. 4 shows D1 illustrating the result of simulation in the case where the submount member 20 was the translucent ceramic substrate. FIG. 4 shows D2 illustrating the result of simulation in the case where the submount member 20 was the Al substrate. Note that, in the simulation, it was assumed that only Fresnel loss was likely to occur at the side face of the LED chip 4. Further, the simulation was geometrical optics simulation based on ray tracing by the Monte Carlo method.

According to the results of simulation shown in FIG. 4, D1 and D2 show the light-outcoupling efficiencies of about 70% when the optical absorptance at the light emitting layer 43 is about 0.2%, and these values of the light-outcoupling efficiencies are close to actual measured values.

Figure 5:
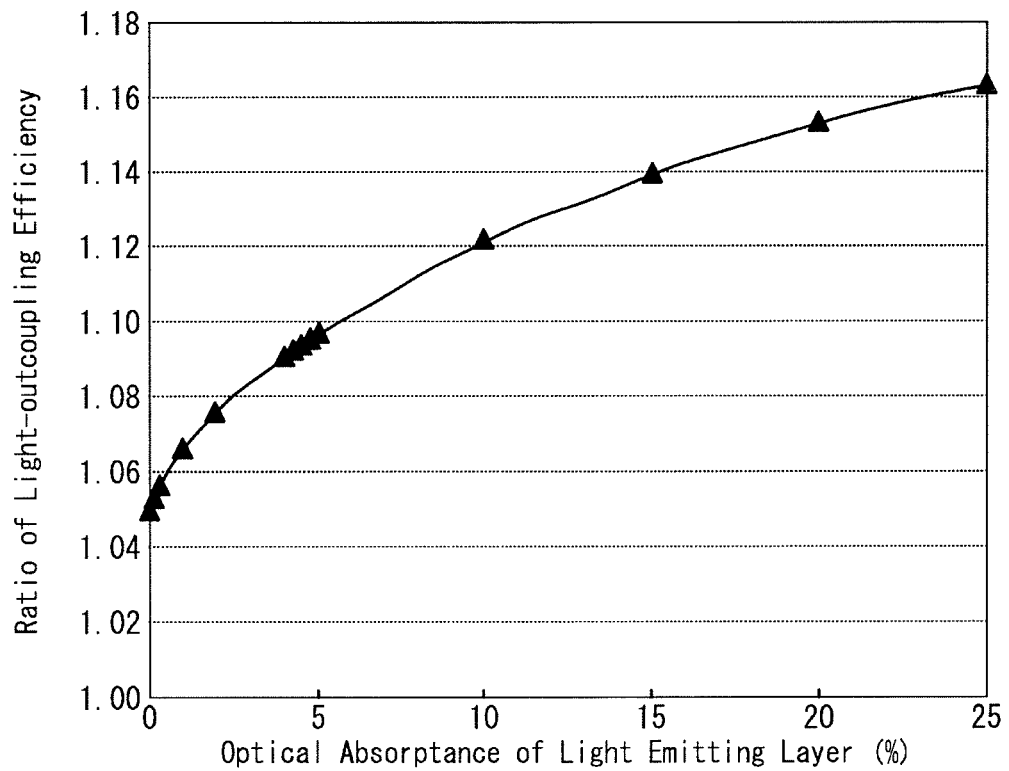
FIG. 5 is a diagram illustrating a relationship between the absorptance and a ratio of the light-outcoupling efficiency of the light emitting layer of the LED chip regarding the structure of the reference example 1.

FIG. 5 shows a relationship between optical absorptance and a light-outcoupling efficiency ratio of the light emitting layer 43. The light-outcoupling efficiency ratio is defined as a ratio of a light-outcoupling efficiency of the structure of the reference example 1 where the submount member 20 is the translucent ceramic substrate to a light-outcoupling efficiency of the other structure of the reference example 1 where the submount member 20 is the Al substrate.

FIG. 5 shows that the light-outcoupling efficiency ratio is greater than 1 irrespective of the magnitude of the optical absorptance of the light emitting layer 43. In summary, FIG. 5 teaches that the structure of the reference example 1 where the submount member 20 is the translucent ceramic substrate is higher in the light-outcoupling efficiency than the other structure of the reference example 1 where the submount member 20 is the Al substrate if the light emitting layers 43 of the both structures have the same optical absorptance. The result that the structure of the reference example 1 where the submount member 20 is the translucent ceramic substrate is higher in the light-outcoupling efficiency than the other structure of the reference example 1 where the submount member 20 is the Al substrate was confirmed by the actual measurement values.

Figure 6:
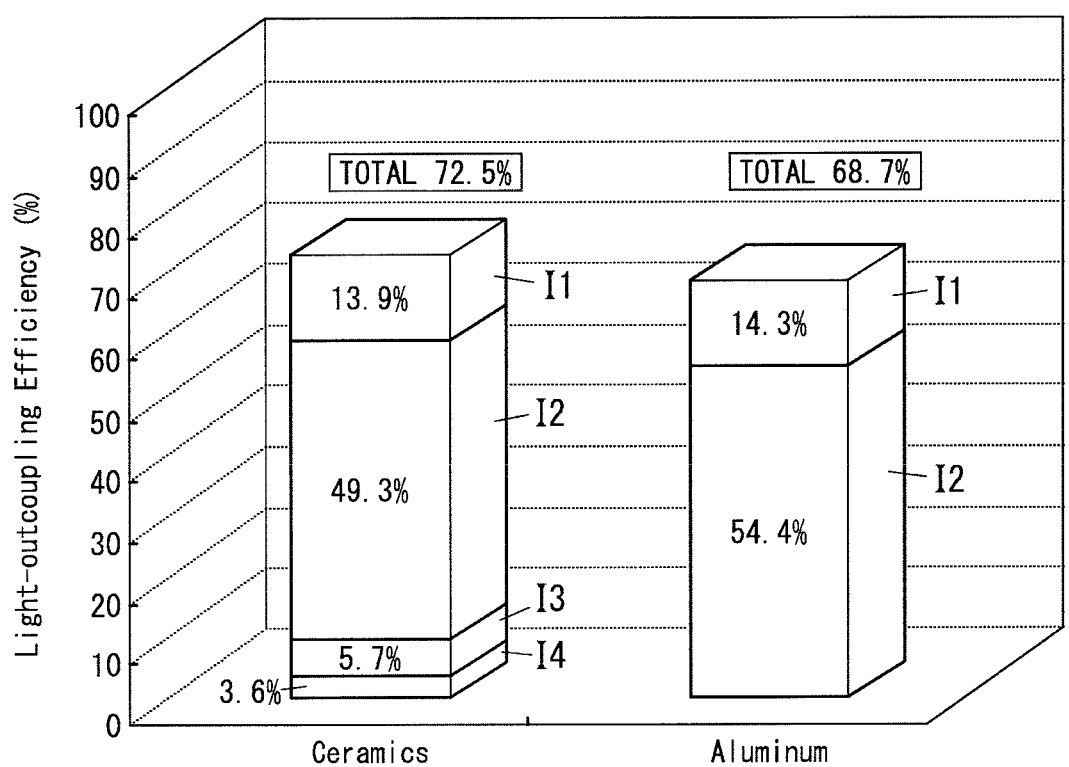
FIG. 6 is a diagram illustrating a result of simulation of a breakdown of the light-outcoupling efficiency of the structure of the reference example 1.

FIG. 6 shows a result of simulation of breakdowns of the light-outcoupling efficiencies of the different structures of the reference example 1 where the submount member 20 is the translucent ceramic substrate and where the submount member 20 is the Al substrate. In FIG. 6, a case where the material of the substrate is ceramics indicates the structure where the submount member 20 is the translucent ceramic substrate, and a case where the material of the substrate is aluminum indicates the structure where the submount member 20 is the Al substrate. With regard to the breakouts of the light-outcoupling efficiencies, "I1" in FIG. 6 means the light-outcoupling efficiency with regard to the face of the LED chip 4. Further, "I2" in FIG. 6 means the light-outcoupling efficiency with regard to the side face of the LED chip 4. Further, "I3" in FIG. 6 means the light-outcoupling efficiency with regard to the exposed surface (upper surface) of the submount member 20 close to the LED chip 4. Further, "I4" in FIG. 6 means the light-outcoupling efficiency with regard to the side surface and the further exposed surface (lower surface) of the submount member 20 opposite from the LED chip 4.

As apparent from FIG. 6, with regard to the structure of the reference example 1 where the submount member 20 is the Al substrate, "I3" and "I4" are zero, whereas with regard to the different structure of the reference example 1 where the submount member 20 is the translucent ceramic substrate, "I1" and "I2" slightly decrease but "I3" and "I4" give the total of the light-outcoupling efficiency of 9.3%, and the light-outcoupling efficiency increases as a whole.

Figure 7:
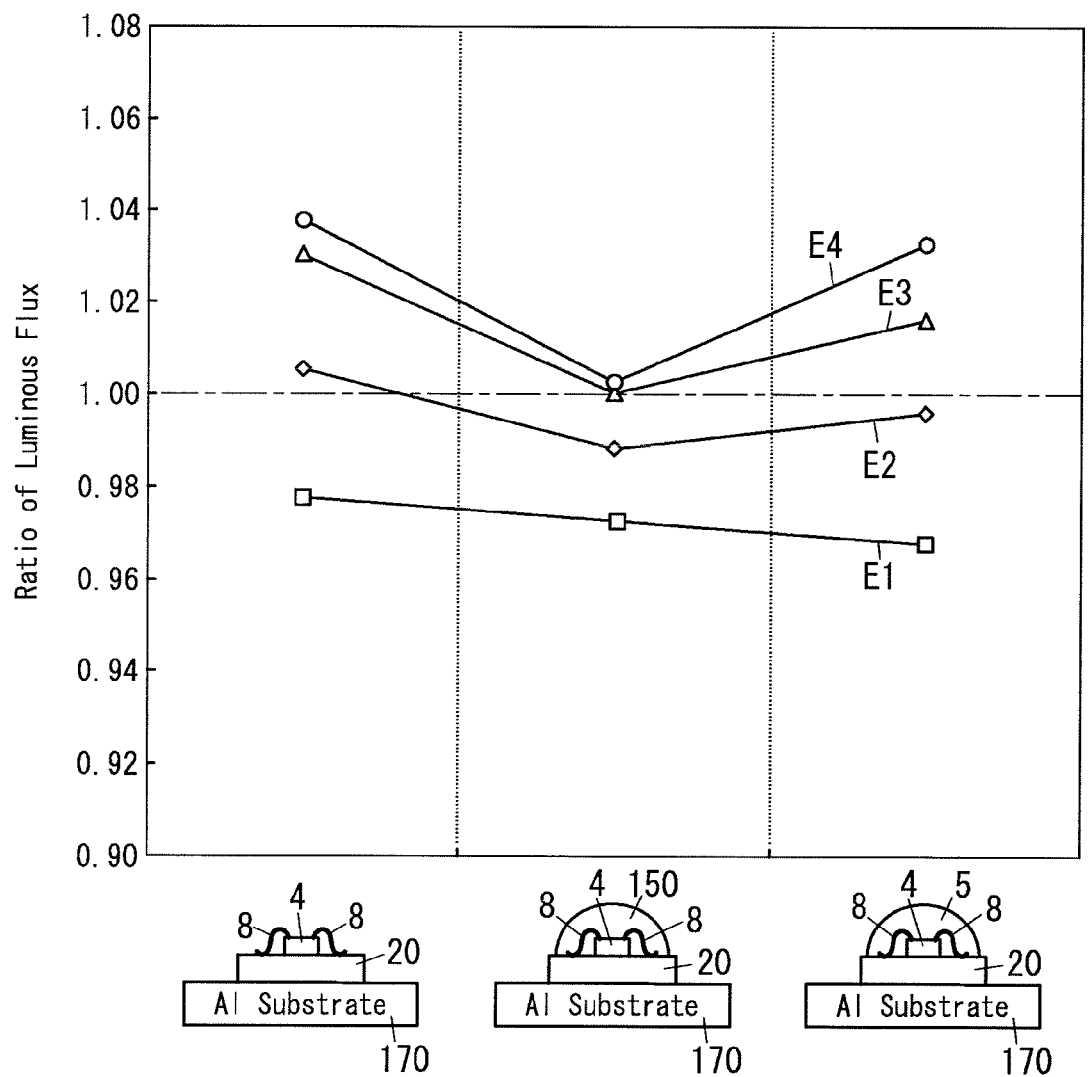
FIG. 7 is an explanatory view illustrating results of measurement of luminous fluxes of reference examples 2, 3, and 4.
Figure 8:
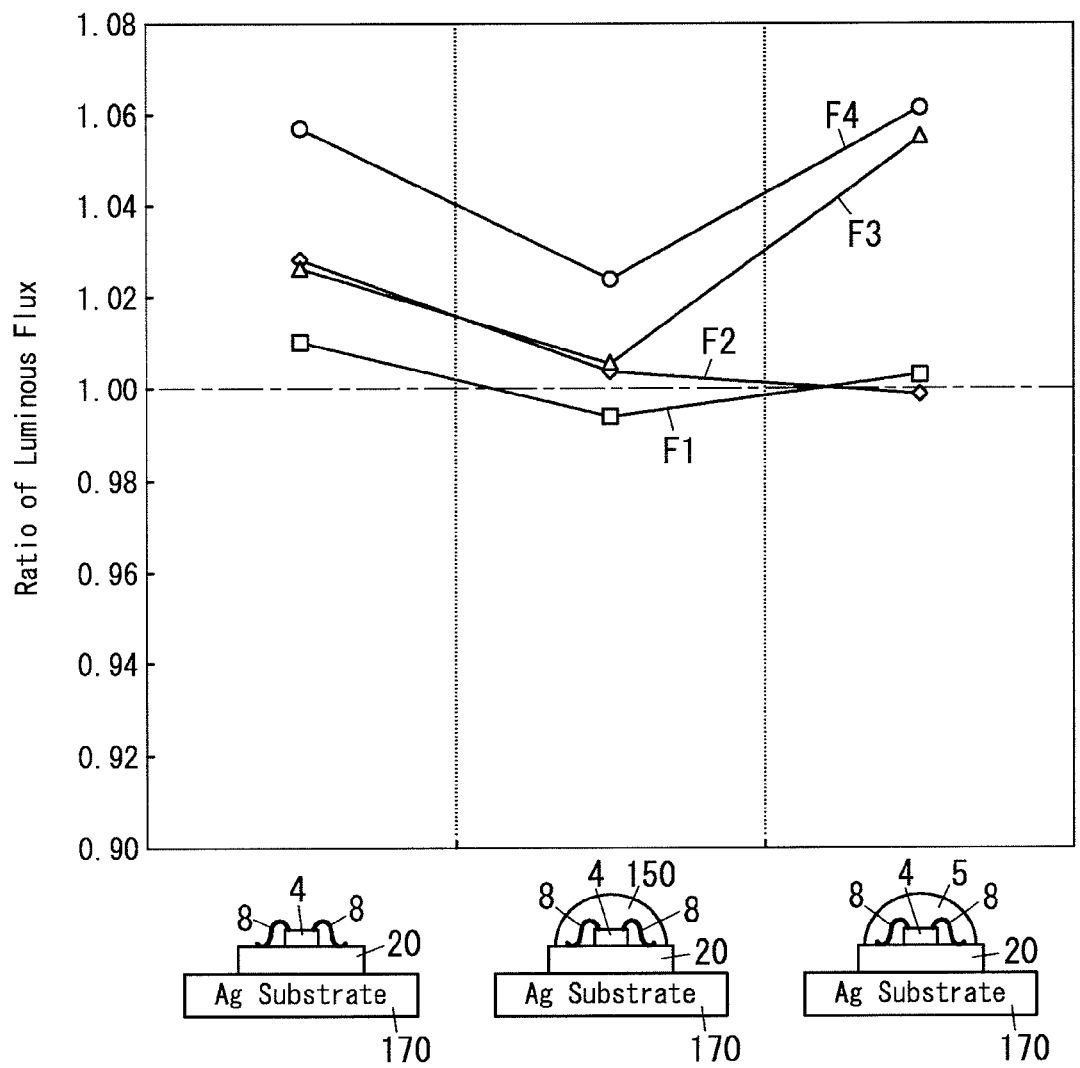
FIG. 8 is an explanatory view illustrating results of measurement of luminous fluxes of the reference examples 2, 3, and 4.

FIGS. 7 and 8 show diagrams illustrating results of measurement of luminous fluxes by an integrating sphere of instances in which the submount members 20 have the same planar size of 2 mm□ (2 mm×2 mm) but have the different thicknesses, for each of the structure of the reference example 2 shown at the lower-left part of each of FIGS. 7 and 8, the structure of the reference example 3 shown at the lower-middle part of each of FIGS. 7 and 8, and the structure of the reference example 4 shown at the lower-right part of each of FIGS. 7 and 8. The structure of the reference example 2 is different from the structure of the reference example 1 in further including the support member 170 which is placed on the oppose side of the submount member 20 from the LED chip 4. The structure of the reference example 3 is different from the structure of the reference example 2 in further including an encapsulating part 150 which is of silicone resin and encapsulates the LED chip 4. The structure of the reference example 4 is different from the structure of the reference example 2 in further including the color converter 5 covering the LED chip 4. The transparent material of the color converter 5 is silicone resin and the wavelength conversion material of the color converter 5 is yellow phosphor. FIGS. 7 and 8 are different in only that the support member 170 of FIG. 7 is the Al substrate and the support member 170 of FIG. 8 is the Ag substrate. Note that, the reflectances of the Al substrate and the Ag substrate are about 78% and 98%, respectively.

Further, E1, E2, E3, and E4 in FIG. 7 show luminous flux ratios with regard to the submount members 20 with thicknesses of 0.4 mm, 0.6 mm, 0.8 mm, and 1.0 mm, respectively. Further, F1, F2, F3, and F4 in FIG. 8 show luminous flux ratios with regard to the submount members 20 with thicknesses of 0.4 mm, 0.6 mm, 0.8 mm, and 1.0 mm, respectively. The luminous flux ratios of the structures of the reference examples 2, 3, and 4 are respectively defined as ratios of luminous fluxes of the structures of the reference examples 2, 3, and 4 to a luminous flux of a standard structure in which the submount member 20 is a high-purity alumina substrate having a thickness of 1.0 mm and the support member 170 is not included. Hence, with regard to the results of FIGS. 7 and 8, the luminous flux ratio of the structure of interest which is greater than 1 means that the structure of interest is greater in the luminous flux than the standard structure, and the luminous flux ratio of the structure of interest which is smaller than 1 means that the structure of interest is smaller in the luminous flux than the standard structure.

Based on the results of FIG. 7, the present inventors considered that using the submount member 20 of the thickness of 0.8 mm or more in the structure of the reference example 4 in which the support member 170 is the Al substrate may allow the luminous flux to be greater than the standard structure. Further, based on the results of FIG. 8, the present inventors considered that using the submount member 20 of the thickness of 0.8 mm or more in the structure of the reference example 4 in which the support member 170 is the Ag substrate may allow the luminous flux to be greater than the standard structure. Conversely, the present inventors considered that, with regard to the structure of the reference example 4 in which the support member 170 is a metal plate such as the Al substrate and the Ag substrate, thinning of the submount member 20 is limited in view of improvement of the light-outcoupling efficiency.

Further, in order to reduce an amount of light to be returned to the LED chip 4 by causing diffuse reflection of light which arrives at the support member 170 from the LED chip 4, the present inventors examined the use of a white diffusely reflective substrate as the support member 170.

Figure 9:
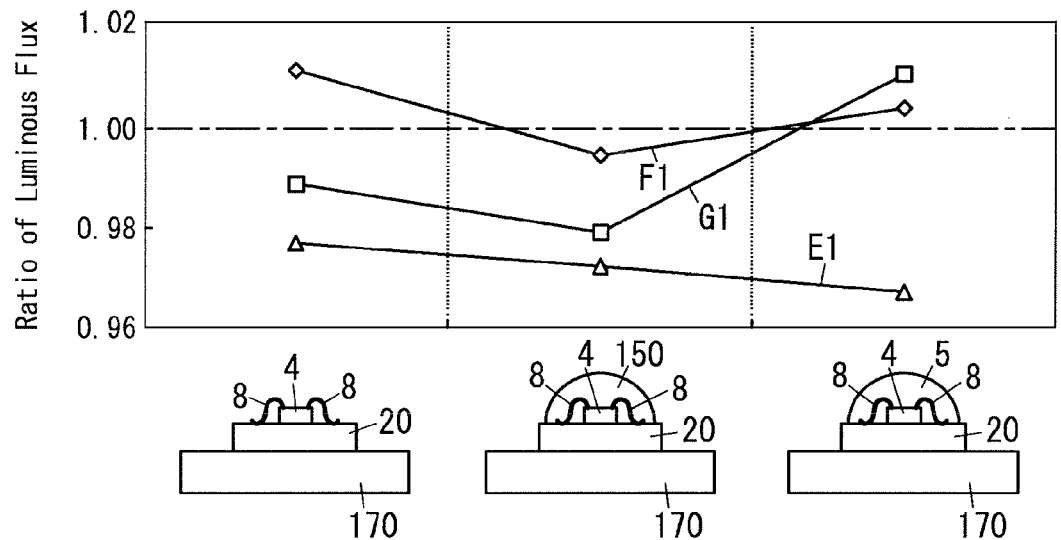
FIG. 9 is an explanatory view illustrating results of measurement of luminous fluxes of the reference examples 2, 3, and 4.

FIG. 9 shows diagram illustrating results of measurement of luminous fluxes by an integrating sphere of an instance in which the submount member 20 has a planar size of 2 mm□ and a thickness of 0.4 mm, for each of the structures of the reference examples 2, 3, and 4.

Figure 10:
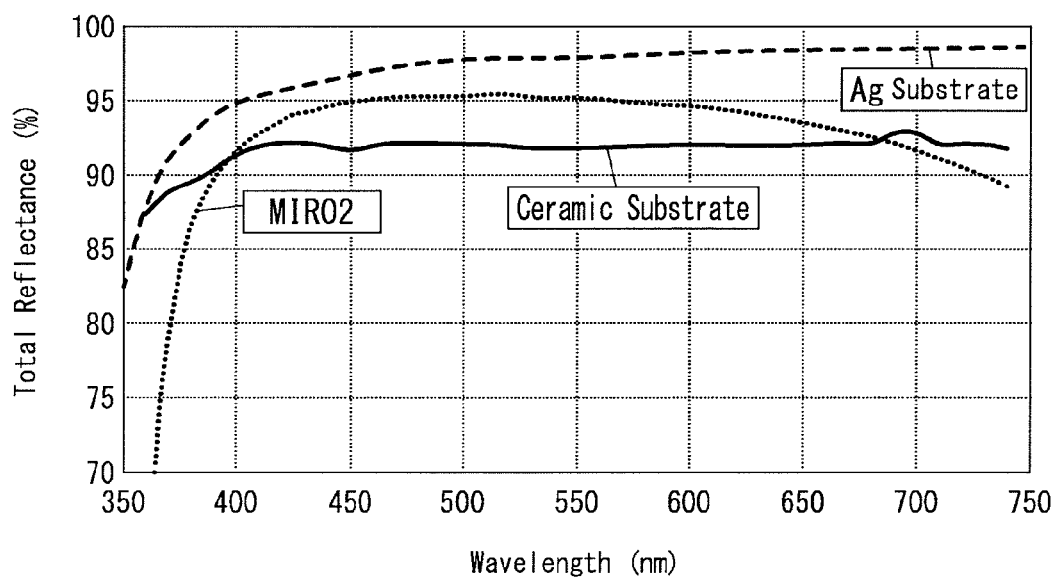
FIG. 10 is an explanatory view illustrating a relationship between a total reflectivity and a wavelength.

E1 in FIG. 9 shows the luminous flux ratio with regard to the support member 170 made of the Al substrate. F1 in FIG. 9 shows the luminous flux ratio with regard to the support member 170 made of the Ag substrate. G1 in FIG. 9 shows the luminous flux ratio with regard to the support member 170 made of the white diffusely reflective substrate (white coated substrate). The reflectance of the diffusely reflective substrate is about 92%. Note that, FIG. 10 shows wavelength dependencies of the reflectances of the Ag substrate, MIRO2, and the ceramic substrate (i.e., the aforementioned high-purity alumina substrate) which were compared and examined by the present inventors.

In FIG. 9, the luminous flux ratios of the structures of the reference examples 2, 3, and 4 are respectively defined as ratios of the luminous fluxes of the structures of the reference examples 2, 3, and 4 to a luminous flux of a standard structure in which the submount member 20 is a high-purity alumina substrate having a thickness of 1.0 mm and the support member 170 is not included. Hence, with regard to the results of FIG. 9, the luminous flux ratio of the structure of interest which is greater than 1 means that the structure of interest is greater in the luminous flux than the standard structure, and the luminous flux ratio of the structure of interest which is smaller than 1 means that the structure of interest is smaller in the luminous flux than the standard structure.

Based on the results of FIG. 9, the present inventors obtained the knowledge that using the diffusely reflective substrate as the support member 170 can improve the light-outcoupling efficiency relative to using the metal substrate such as the Al substrate and the Ag substrate as the support member 170.

Therefore, the present inventors have conceived the LED module 1 of the present embodiment based on this knowledge.

As mentioned above, the LED module 1 includes: the light-diffusing substrate 2 which is light transmissive; the LED chip 4 which is bonded to the first surface 2sa of the light-diffusing substrate 2 via the first bond 3 which is transparent; and the color converter 5 which faces the first surface 2sa of the light-diffusing substrate 2 and covers the LED chip 4. The color converter 5 includes: the phosphor to, when excited by light emitted from the LED chip 4, emit light with a different color from the light from the LED chip 4; and the transparent material. Further, the LED module 1 includes the mounting substrate 7 including the diffuse reflection layer 6 which is placed facing the second surface 2sb of the light-diffusing substrate 2 and diffusely reflects light emitted from the LED chip 4 and light emitted from the phosphor. The LED module 1 includes the light-transmissive light-diffusing substrate 2, and the diffuse reflection layer 6 which is placed on/over the second surface of the light-diffusing substrate 2 and diffusely reflects light emitted from the LED chip 4 and light emitted from the phosphor, and thereby the light-outcoupling efficiency can be improved and the light output (luminous flux) can be enhanced. Further it is presumed that in the LED module 1, owing to the light guiding effect of the light-diffusing substrate 2, the light-outcoupling efficiency can be improved and further the diffuse reflection layer 6 diffusely reflects light which is emitted from the LED chip 4 and passes through the light-diffusing substrate 2 from the first surface 2sa to the second surface 2sb and thus the amount of light to be converted by the phosphor of the color converter 5 can be increased and therefore the light-outcoupling efficiency can be improved.

Further, in the LED module 1 of the present embodiment, the patterned wiring conductor 71 is designed to cover most of the surface of the resin part 72 close to the light-diffusing substrate 2, and thereby heat which is generated by the LED chip 4 and then transferred to the patterned wiring conductor 71 can be spread in the thickness direction and the lateral directions (in-plane directions) of the patterned wiring conductor 71 and then transferred to the resin part 72. Hence, the heat dissipating properties of the LED module 1 are improved and thus an increase in the temperature of the LED chip 4 can be suppressed, and therefore the light output can be more enhanced.

The patterned wiring conductor 71 of the mounting substrate 7 may be extended until the periphery of the resin part 72 in a plan view. However, when a member (e.g., a fixture body of a lighting fixture) on which the LED module 1 is to be mounted is made of electrically conductive material, it is preferable that extension of the patterned wiring conductor 71 be limited so that the patterned wiring conductor 71 is inside the aforementioned periphery to ensure a desired creepage distance between the patterned wiring conductor 71 and this member.

Further, in the LED module 1, the mounting substrate 7 includes the resin part 72 facing the rear surface of the patterned wiring conductor 71, and thereby properties of lighting surge protection can be improved when the LED module 1 is used as being placed on a metal part (e.g., a metal fixture body or a heat dissipater of a lighting fixture).

Further, in the LED module 1 of the present embodiment, the mounting substrate 7 includes the diffuse reflection layer 6, and therefore loss of light caused by the patterned wiring conductor 71 can be reduced and thereby the light output can be improved.

(Embodiment 2)

Figure 11A:
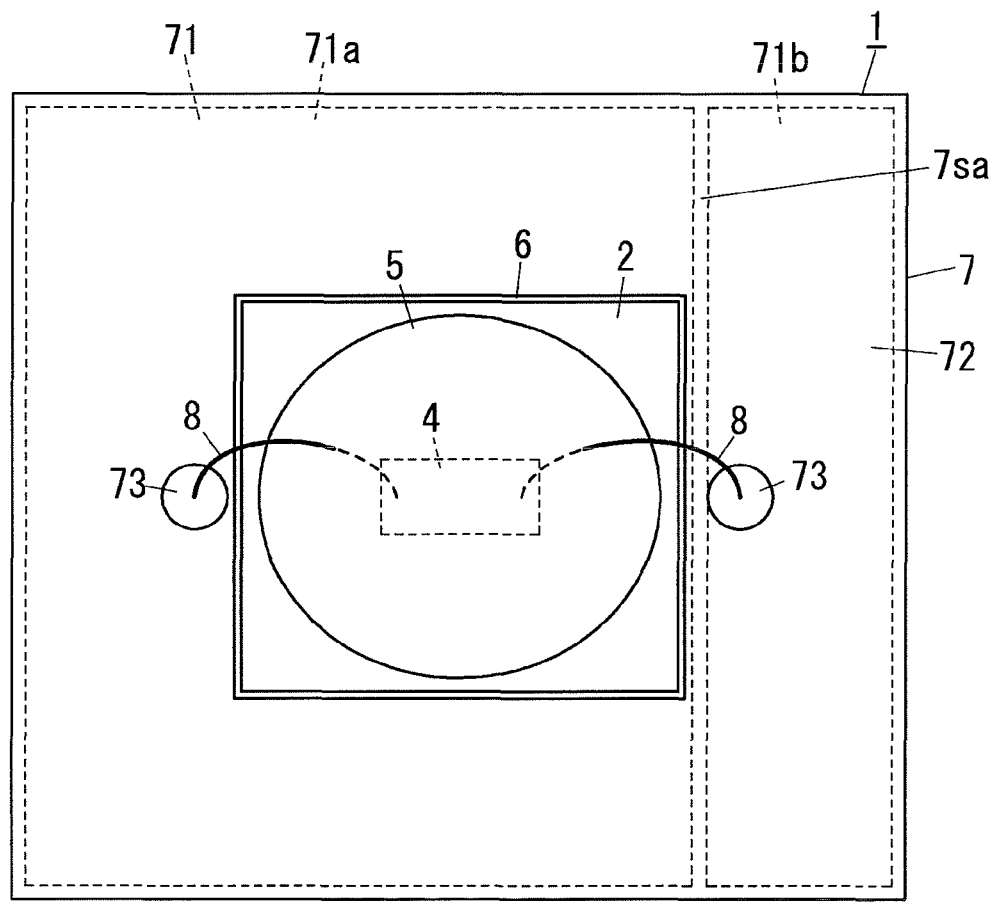
FIG. 11A is a schematic plan view illustrating an LED module of the embodiment 2.
Figure 11B:
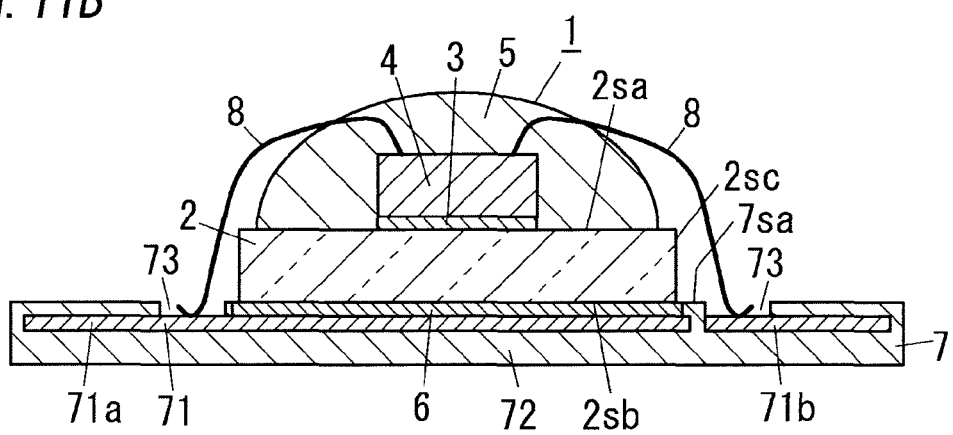
FIG. 11B is a schematic sectional view illustrating the LED module of the embodiment 2.

Hereinafter, an LED module 1 of the present embodiment is described with reference to FIG. 11.

The LED module 1 of the present embodiment is different from the LED module 1 of the embodiment 1 in mainly that a diffuse reflection layer 6 is formed on a second surface 2sb of a light-diffusing substrate 2, and an opposite surface of the diffuse reflection layer 6 from the light-diffusing substrate 2 is bonded to a front surface of a patterned wiring conductor 71 via a transparent second bond (not shown). Note that the same components of the embodiment 2 as the embodiment 1 are designated by the same reference signs as the embodiment 1 so as to avoid the redundant description.

Further, the diffuse reflection layer 6 is not formed on a mounting substrate 7, and a resin part 72 covers most of part of the front surface of the patterned wiring conductor 71 which is not bonded to the diffuse reflection layer 6, in addition to a rear surface of the patterned wiring conductor 71.

Further, the mounting substrate 7 includes, at the resin part 72, holes 73 which expose parts of the front surface of the patterned wiring conductor 71 and allows passage of respective second ends of the wires 8 having first ends respectively bonded to the first electrode and the second electrode of the LED chip 4.

The LED module 1 of the present embodiment includes the light-transmissive light-diffusing substrate 2, and the diffuse reflection layer 6 which is placed on/over the second surface 2sb of the light-diffusing substrate 2 and diffusely reflect light emitted from the LED chip 4 and light emitted from the phosphor, and thereby the light-outcoupling efficiency can be improved and the light output (luminous flux) can be enhanced.

In the LED module 1 of the present embodiment, to increase the reflectance of the resin part 72, appropriate filler may be added to the resin of the resin part 72. By way of one example, the resin part 72 may include unsaturated polyester as its resin and titania as its filler. In this example, in the LED module 1, optical absorption at the resin part 72 and the patterned wiring conductor 71 of the mounting substrate 7 can be suppressed, and therefore the light-outcoupling efficiency can be more improved.

(Embodiment 3)

Figure 12A:
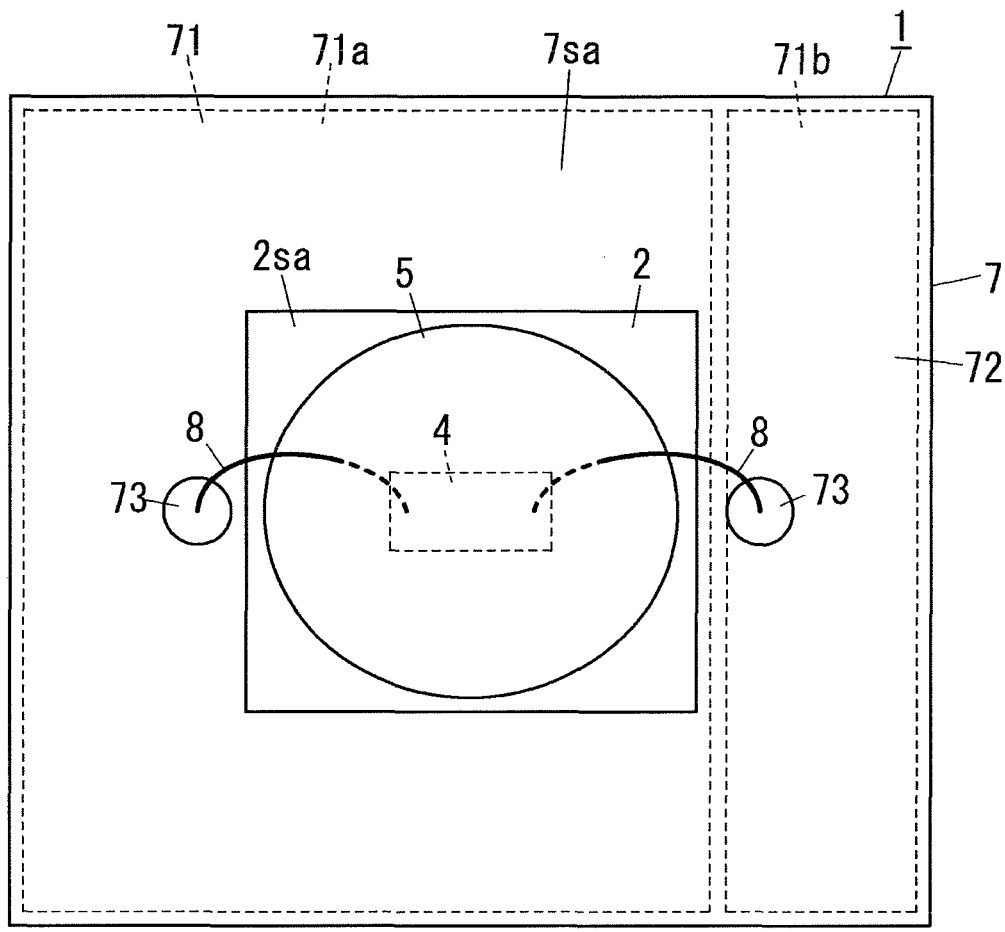
FIG. 12A is a schematic plan view illustrating an LED module of the embodiment 3.
Figure 12B:
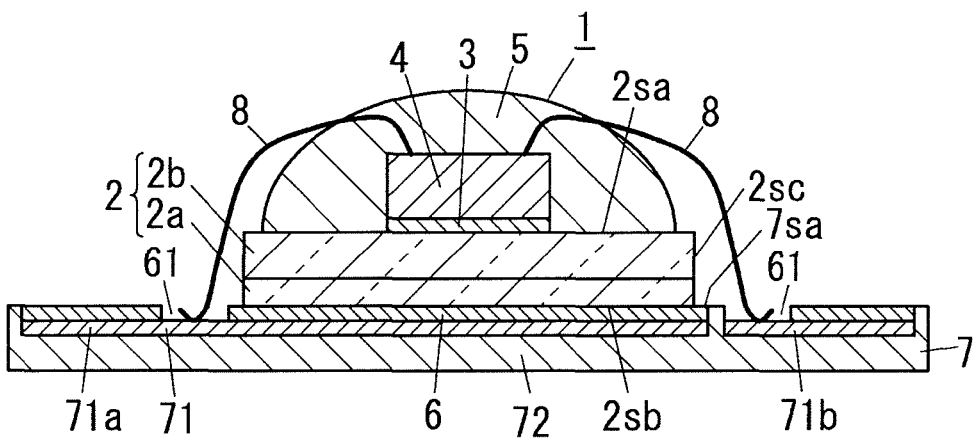
FIG. 12B is a schematic sectional view illustrating the LED module of the embodiment 3.
Figure 13:
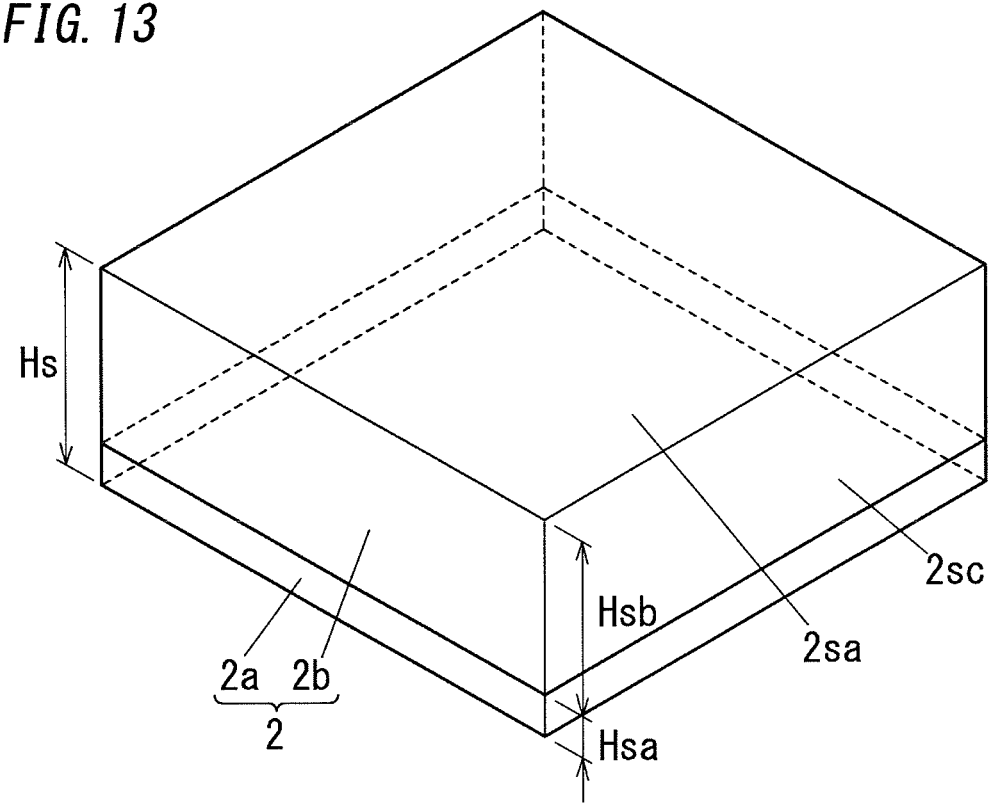
FIG. 13 is a schematic perspective view illustrating a light diffusing substrate of the LED module of the embodiment 3.

Hereinafter, an LED module 1 of the present embodiment is described with reference to FIGS. 12 and 13.

The LED module 1 of the present embodiment is different from the LED module 1 of the embodiment 1 in that a light-diffusing substrate 2 is constituted by two ceramic layers 2a and 2b stacked in a thickness direction of the light-diffusing substrate 2. Note that the same components of the embodiment 2 as the LED module 1 of the embodiment 1 are designated by the same reference signs as the embodiment 1 so as to avoid the redundant description.

In the light-diffusing substrate 2, the ceramic layers 2a and 2b have different optical properties from each other, and the ceramic layer 2a, which is farther from an LED chip 4, is higher in reflectance with respect to light emitted from the LED chip 4. In this regard, the optical properties refer to reflectance, transmittance, absorptance, or the like. The light-diffusing substrate 2 is required to be constituted by at least two ceramic layers stacked in the thickness direction, and have such a property that optical characteristics of the ceramic layers are different from each other, and the further the ceramic layer is from the LED chip 4, the higher the reflectance thereof is with respect to the light emitted from the LED chip 4.

Accordingly, in the LED module 1, light emitted from a light emitting layer 43 (see FIG. 2A) of the LED chip 4 toward the further face of the LED chip 4 in the thickness direction is more likely to be reflected at an interface between the ceramic layer 2b and the ceramic layer 2a. Therefore, in the LED module 1, it is possible to prevent light which is emitted from the LED chip 4 toward the light-diffusing substrate 2 from returning to the LED chip 4 and to prevent the light from entering a mounting substrate 7. As a result, an amount of light which emerges outside through the first surface 2sa and the side face 2sc of the light-diffusing substrate 2 can be increased. Consequently, it is possible to improve the light-outcoupling efficiency of the LED module 1 and to reduce influences of the reflectance of the mounting substrate 7 on the light-outcoupling efficiency, and therefore suppress deterioration with time in the light-outcoupling efficiency.

With regard to the light-diffusing substrate 2, the uppermost ceramic layer 2b that is the closest to the LED chip 4 may be referred to as a first ceramic layer 2b, and the lowermost ceramic layer 2a that is the farthest from the LED chip 4 may be referred to as a second ceramic layer 2a, to simplify the description.

The first ceramic layer 2b may be made of alumina ($Al_2O_3$), for example. The first ceramic layer 2b may be an alumina substrate, for example. When the first ceramic layer 2b is the alumina substrate, the particle diameter of alumina particles of the alumina substrate is preferably in a range between 1 μm to 30 μm. The larger the particle diameter of the alumina particles, the smaller the reflectance of the first ceramic layer 2b. The smaller the particle diameter of the alumina particles, the larger the scattering effect of the first ceramic layer 2b. In short, reducing the reflectance and increasing the scattering effect are in a trade-off relationship.

The aforementioned particle diameter is determined by a number-size distribution curve. Here, the number-size distribution curve is obtained by measuring a particle size distribution by an imaging method. Specifically, the particle diameter is determined by a particle size (two-axis average diameter) and the number of particles determined by image processing of a SEM image obtained by scanning electron microscope (SEM) observation. In the number-size distribution curve, the particle diameter value at the integrated value of 50% is referred to as a median diameter (d50), and the aforementioned particle diameter refers to the median diameter.

Figure 14:
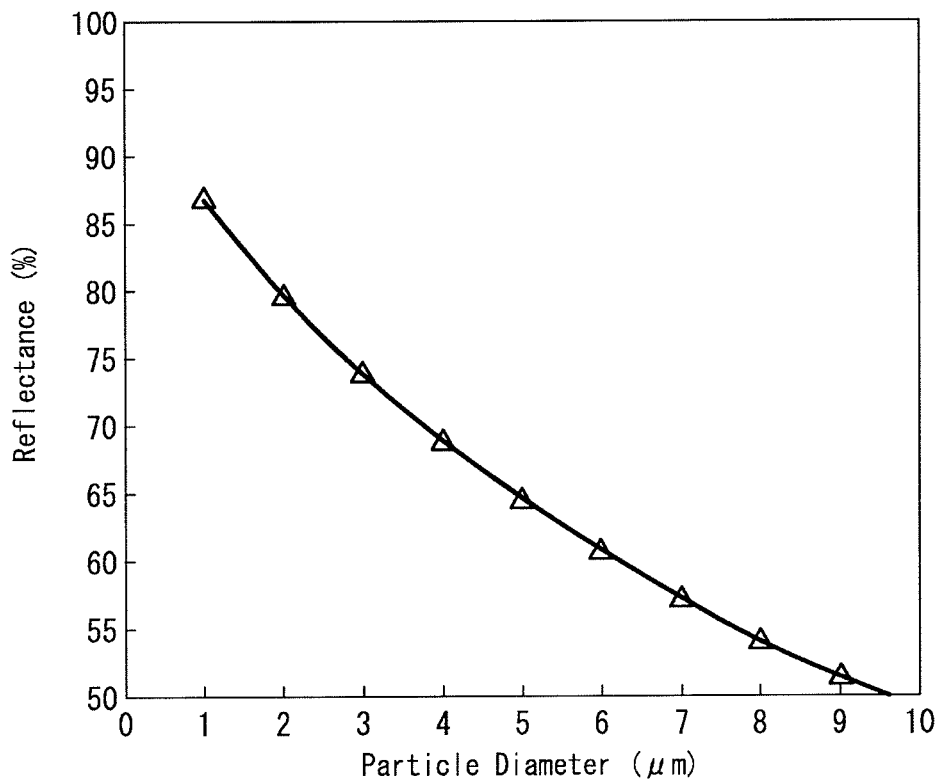
FIG. 14 is an explanatory view illustrating a relationship between a particle diameter and a reflectivity of an alumina particle.

Note that, FIG. 14 shows a theoretical relation between the particle diameter and the reflectance of a spherical alumina particle in the alumina substrate. The smaller the particle diameter, the higher the reflectance. The relation of the first ceramic layer 2b between the median diameter (d50) and the measured value of reflectance is approximately the same as the theoretical value shown in FIG. 14. The reflectance is measured using a spectrophotometer and an integrating sphere.

The second ceramic layer 2a may be made of, for example, a composite material that contains $SiO_2$, $Al_2O_3$, material having a higher refractive index than $Al_2O_3$ (such as $ZrO_2$ and $TiO_2$), CaO, and BaO as components. In the second ceramic layer 2a, the particle diameter of $Al_2O_3$ particles is preferably in a range between 0.1 μm to 1 μm. The optical properties (such as reflectance, transmittance, and absorptance) of the second ceramic layer 2a can be adjusted by adjusting components, composition, particle diameter, thickness, or the like of the composite material. In the light-diffusing substrate 2, when the first ceramic layer 2b and the second ceramic layer 2a are made of the same kind of material, the first ceramic layer 2b should be made of a material having the particle diameter larger than that for the second ceramic layer 2a.

In a reference example of the LED module 1, the light-diffusing substrate 2 has a thickness Hs of 0.5 mm, the second ceramic layer 2a has a thickness Hsa of 0.1 mm, the second ceramic layer 2a has a reflectance of 96% for light with a wavelength of 450 nm, the first ceramic layer 2b has a thickness of Hsb of 0.4 mm, and the first ceramic layer 2b has a reflectance of 80% for light with a wavelength of 450 nm. However, these numerical values are only examples, and they are not limited to these numerical values. Further, in the reference example of the LED module 1, the light-diffusing substrate 2 has a planar size of 2 mm□ (2 mm×2 mm), but is not limited to having this planar size.

Figure 15:
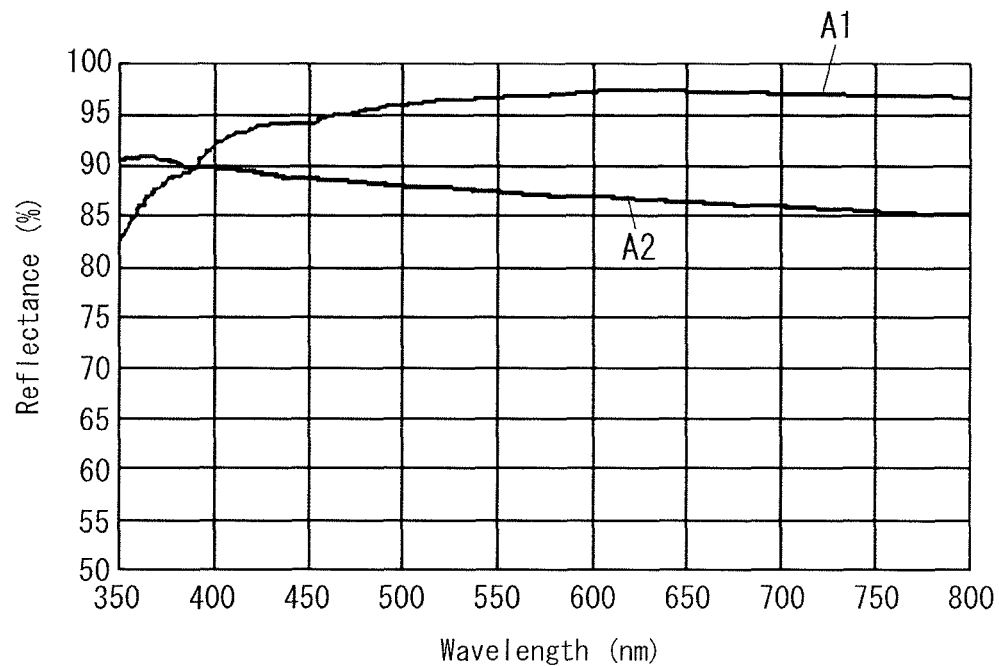
FIG. 15 is a diagram illustrating reflectivity and wavelength characteristics of the light diffusing substrate and an alumina substrate of an example of the LED module of the embodiment 3.

Note that, reflectance-wavelength characteristics of the light-diffusing substrate 2 used in the reference example of the LED module 1 are as shown by a curve denoted by reference sign A1 in FIG. 15, and reflectance-wavelength characteristics of a single layer alumina substrate with a thickness of 0.4 mm are as shown by a curve denoted by reference sign A2 in FIG. 15. Note that, the reflectance-wavelength characteristics shown in FIG. 15 were measured with a spectrophotometer and an integrating sphere.

The first ceramic layer 2b is a first dense layer composed of ceramics sintered at a high temperature in an approximate range of 1500° C. to 1600° C. The first ceramic layer 2b has good rigidity compared with the second ceramic layer 2a, because ceramic particles are bonded strongly to each other by the high temperature sintering. Here, the good rigidity means that a flexural strength is relatively high. As material of the first ceramic layer 2b, alumina is preferable.

The second ceramic layer 2a is composed of ceramics sintered at 1000° C. or less (850° C. to 1000° C., for example) which is a relatively low temperature compared with the sintering temperature of the first ceramic layer 2b. The ceramics constituting the second ceramic layer 2a may be a second dense layer which contains ceramic fillers (ceramic microparticles) and a glass component, or a porous layer containing ceramic fillers (ceramic microparticles) and a glass component, for example.

The second dense layer is composed of dense ceramics in which ceramic fillers are bound each other by sintering and glass components are arranged around the ceramic fillers as a matrix. In the second dense layer, the ceramic filler mainly performs a function of reflecting light. The second dense layer may be made of borosilicate glass, glass ceramics which contains lead borosilicate glass and alumina, a material in which a ceramic filler is mixed to glass ceramics which contains soda-lime glass and alumina, or the like. The glass content of the glass ceramics is preferably set in a range of around 35 to 60 wt %. The ceramics content of the glass ceramics is preferably set in a range of around 40 to 60 wt %. Note that, in the second dense layer, the zinc component of the lead borosilicate glass can be substituted for titanium oxide or tantalum oxide to increase refractive index of the glass ceramics. The ceramic filler is preferably made of a material having higher refractive index than glass ceramics, and may be, for example, tantalum pentoxide, niobium pentoxide, titanium oxide, barium oxide, barium sulfate, magnesium oxide, calcium oxide, strontium oxide, zinc oxide, zirconium oxide, or silicate oxide (zircon).

Figure 16:
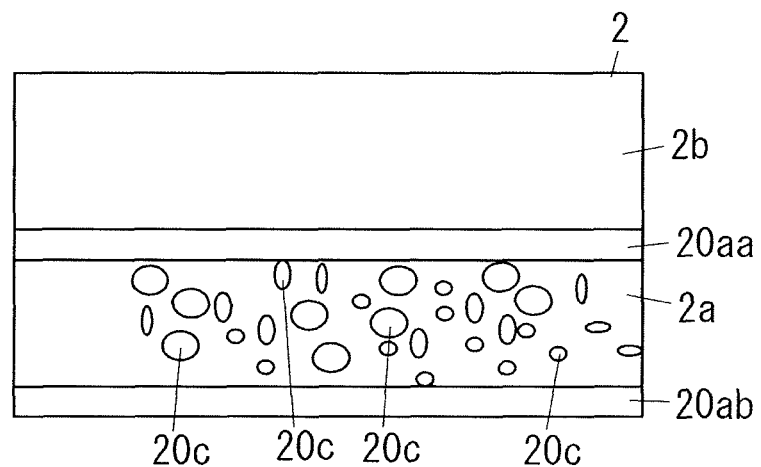
FIG. 16 is a schematic explanatory view illustrating the light diffusing substrate of the LED module of the embodiment 3.

When the second ceramic layer 2a is constituted by a porous layer (hereinafter, "second ceramic layer 2a" of this case is also referred to as "porous layer 2a"), it is preferable that a first glass layer 20aa is interposed between the porous layer 2a having a plurality of pores 20c and the first ceramic layer 2b, and a second glass layer 20ab is formed on an opposite side of the porous layer 2a from the first ceramic layer 2b, as shown in the schematic diagram in FIG. 16. The porosity of the porous layer 2a is set to around 40%, but is not limited thereto. Each of the first glass layer 20aa and the second glass layer 20ab is a transparent layer of a glass component and thus transmits visible light. The thicknesses of the first glass layer 20aa and the second glass layer 20ab may be set to around 10 μm, for example, but are not limited thereto. Around half of the glass component of each of the first glass layer 20aa and the second glass layer 20ab is $SiO_2$, but the glass component is not limited thereto.

The first glass layer 20aa is positioned to be interposed between the porous layer 2a and the first ceramic layer 2b and is in close contact with surfaces of the porous layer 2a and the first ceramic layer 2b as a result of sintering at the time of manufacture.

The second glass layer 20ab is positioned on the opposite side of the porous layer 2a from the first ceramic layer 2b, and thus protects the porous layer 2a. In this manner, the pores 20c present in the opposite surface of the porous layer 2a from the first ceramic layer 2b are covered with the second glass layer 20ab.

The porous layer 2a contains ceramic fillers (ceramic particulates) and a glass component. In the porous layer 2a, the ceramic fillers are combined to form clusters by sintering, and thereby a porous structure is formed. The glass component serves as a binder for the ceramic fillers. In the porous layer 2a, the ceramic fillers and the plurality of pores 20c mainly perform a function of reflecting light. Note that, the porous layer 2a can be formed in accordance with a manufacturing process of a package disclosed in paragraphs [0023]-[0026] and FIG. 4 of WO 2012/039442 A1.

Figure 17:
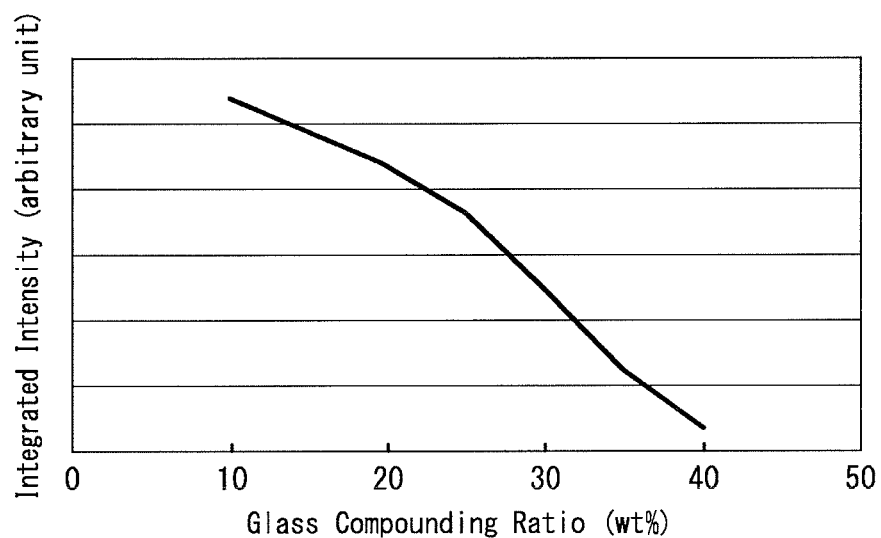
FIG. 17 is an explanatory view illustrating a relationship between a glass compounding ratio and an integrated intensity of an integrating sphere of the light diffusing substrate of the LED module of the embodiment 1.

The reflectance of the porous layer 2a can be changed by, for example, changing a weight ratio between the glass component and the ceramic component (such as alumina and zirconia). That is, the reflectance of the porous layer 2a can be changed by changing the glass compounding ratio. In FIG. 17, the horizontal axis indicates a glass compounding ratio, and the vertical axis indicates an integrated intensity of light which strikes the porous layer 2a and then is reflected measured with an integrating sphere. In measurement with the integrating sphere, intensities of reflected light with wavelengths between 380 to 780 nm are integrated. FIG. 17 teaches that the reflectance can be increased with a decrease in the glass compounding ratio.

Figure 18:
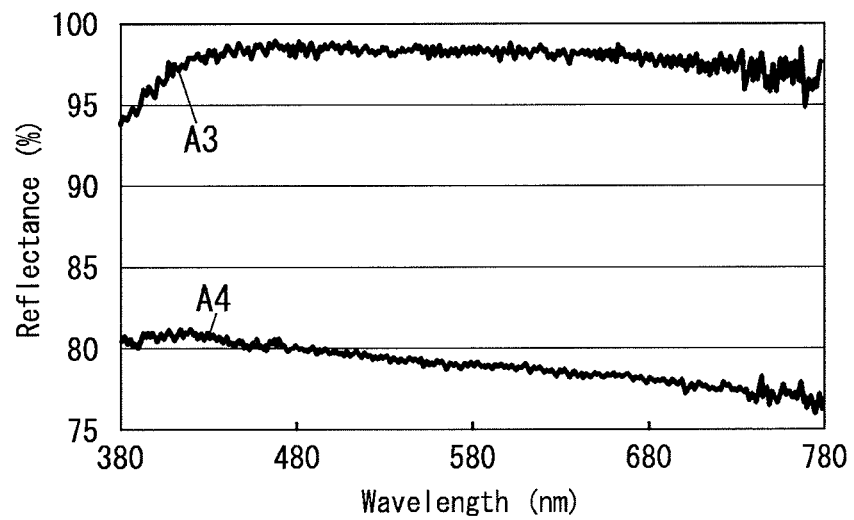
FIG. 18 is a diagram illustrating reflectivity and wavelength characteristics of the light diffusing substrate and an alumina substrate of the example of the embodiment 3.

Accordingly, in the example of the LED module 1 of the present embodiment, the first ceramic layer 2b is formed by sintering alumina at 1600° C., and the porous layer 2a is formed by sintering at 850° C. material prepared by mixing the glass component and the ceramic component at the weight ratio of the glass component to the ceramic component being 20:80. Further in the example, the glass component is borosilicate glass with a median diameter of around 3 μm, and the alumina is a compound of alumina with a median diameter of around 0.5 μm and alumina with a median diameter of around 2 μm, and the zirconia has a median diameter of around 0.2 μm. Further in the example, the first ceramic layer 2b has a thickness of 0.38 mm, and the porous layer 2a has a thickness of 0.10 mm. The reflectance-wavelength characteristics of the light-diffusing substrate 2 in the example are same as those indicated by a curve designated by "A3" in FIG. 18 and the reflectance-wavelength characteristics of the single layer alumina substrate with a thickness of 0.38 mm are same as those indicated by a curve designated by "A4" in FIG. 18. Note that, the weight ratio of the glass component to the ceramic component in the porous layer 2a and the particle diameters (median diameters) of the respective materials are not particularly limited.

At the time of manufacture, the glass components derived from the first glass layer 20aa and the second glass layer 20ab filtrate in the porous layer 2a, and thus the porous layer 2 has a graded composition in which the density of the glass component gradually decreases from the both sides thereof to the center in the thickness direction.

Specifically, as the result of observing a cross-section along the thickness direction of the porous layer 2a with a thickness of around 100 μm with a microscope, it was found out that in regions from respective faces of the porous layer 2a to the depth of around 20 μm in the thickness direction, glass dense layers exist in which glass occupies 70% or more of the area per unit area. In contrast to this, in the internal region deeper than 20 μm from respective faces of the porous layer 2a in the thickness direction, glass occupies around 20% of the area per unit area, and a non-dense layer in which the glass and the ceramic filler are mixed at a certain ratio exists.

In the LED module 1 of the present embodiment, the light-diffusing substrate 2 is constituted by the two ceramic layers 2a and 2b with different optical properties, and the ceramic layer 2a which is further from the LED chip 4 is higher in a reflectance with respect to light emitted from the LED chip 4 than the ceramic layer 2b that is closer to the LED chip 4. Accordingly, the LED module 1 of the present embodiment can be higher in the light-outcoupling efficiency an LED module including the light-diffusing substrate 2 which is constituted by a single layer alumina substrate. In the LED module 1 of the present embodiment, it is possible to reduce an amount of light reflected by the first surface 2sa of the light-diffusing substrate 2, and as a result, absorption loss in the LED chip 4 can be reduced. Furthermore, in the LED module 1 of the present embodiment, the absorptance of light (approximately 0%) of the light-diffusing substrate 2 can be smaller than the absorptance of light (around 2 to 8%, for example) of the mounting substrate 7, and some of rays of light stroking the first surface 2sa of the light-diffusing substrate 2 can be scattered in the first ceramic layer 2b or can be reflected by the interface between the first ceramic layer 2b and the second ceramic layer 2a. Consequently, in the LED module 1, it is possible to reduce an amount of light which passes through the light-diffusing substrate 2 and arrives at the mounting substrate 7 and thus to reduce absorption loss at the mounting substrate 7. As a result, the light-outcoupling efficiency can be improved.

In the LED module 1 of the present embodiment, the first ceramic layer 2b has a higher light transmittance than the second ceramic layer 2a has, and the second ceramic layer 2a has a higher light scattering rate than the first ceramic layer 2b has. Accordingly, it is presumed that, in the LED module 1, light can be diffused in the second ceramic layer 2a that is farther from the LED chip 4, and an amount of light that is diffused without arriving at the mounting substrate 7 increases compared with an LED module including only the first ceramic layer 2b. Also, it is speculated that, in the LED module 1, the possibility that light reflected by the mounting substrate 7 directly beneath the light-diffusing substrate 2 is diffused without returning to the LED chip 4 is increased. In contrast, it is speculated that, in the LED module 1, when the light-diffusing substrate 2 is constituted by only the second ceramic layer 2a, the possibility that light is scattered in the vicinity of the LED chip 4 and then returns to the LED chip 4 may be increased, unfortunately, because the possibility that light emitted from the LED chip 4 toward the light-diffusing substrate 2 is scattered in the vicinity of the LED chip 4 may be increased. Consequently, it is speculated that, in the LED module 1, an amount of light returning to the LED chip 4 can be reduced compared with an LED module including the light-diffusing substrate 2 constituted by only the second ceramic layer 2a. Moreover, in the LED module 1, it is possible to reduce the thickness of the light-diffusing substrate 2 required to obtain the same reflectance as the light-diffusing substrate 2 constituted by only the first ceramic layer 2b.

A color converter 5 is formed on the first surface 2sa of the light-diffusing substrate 2 to have a shape (e.g., a hemispherical shape) so as to cover the LED chip 4 and parts of the wires 8. Therefore, it is preferable that the LED module 1 include an encapsulating part (not shown) which encapsulates exposed parts of the wires 8 and the color converter 5. The encapsulating part is preferably made of transparent material. The transparent material of the encapsulating part may be, for example, silicone resin, epoxy resin, acrylic resin, glass, or organic and inorganic hybrid material in which an organic component and an inorganic component are mixed and/or combined at a nanometer level or molecular level. The transparent material of the encapsulating part is preferably material having a linear expansion coefficient which is close to that of the transparent material of the color converter 5, and is more preferably material having a linear expansion coefficient that is the same as that of the transparent material of the color converter 5. Accordingly, in the LED module 1, it is possible to suppress the concentration of stress on each of the wires 8 in a vicinity of the interface between the encapsulating part and the color converter 5 due to the difference between the linear expansion coefficients of the encapsulating part and the color converter 5. Consequently, in the LED module 1, breakage of the wires 8 can be suppressed. Furthermore, in the LED module 1, it is possible to suppress the occurrence of cracks in the encapsulating part or in the color converter 5 due to the difference between the linear expansion coefficients of the encapsulating part and the color converter 5. The encapsulating part is preferably formed in a hemispherical shape, but the shape thereof is not limited thereto, and may be a semiellipsoidal shape or a semicylindrical shape.

The reason why the light-outcoupling efficiency of the LED module 1 is improved is described with reference to the inferred mechanism diagrams in FIGS. 19, 20A, 20B, and 20C. Note that, even if actual mechanism is different from the inferred mechanism, the LED module 1 of the present embodiment is included in the scope of the present invention.

Figure 19:
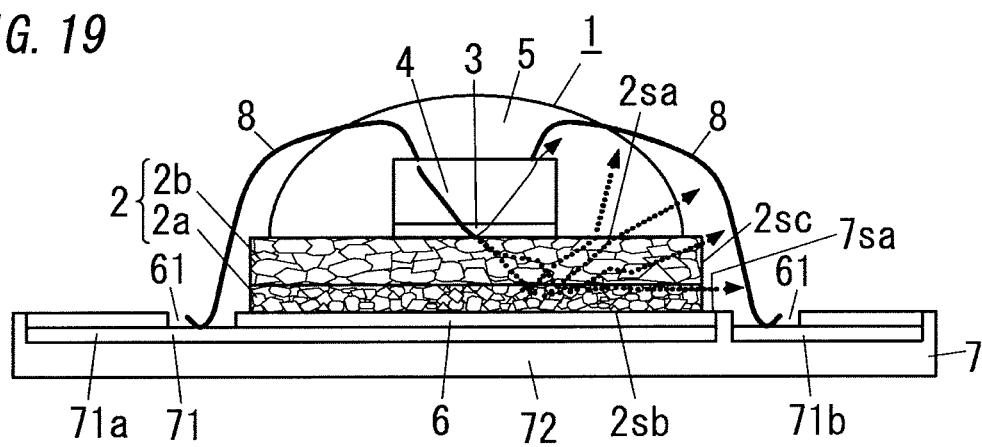
FIG. 19 is an inference mechanism diagram illustrating a principle regarding improvement of the light-outcoupling efficiency of the LED module of the embodiment 3.
Figure 20A:
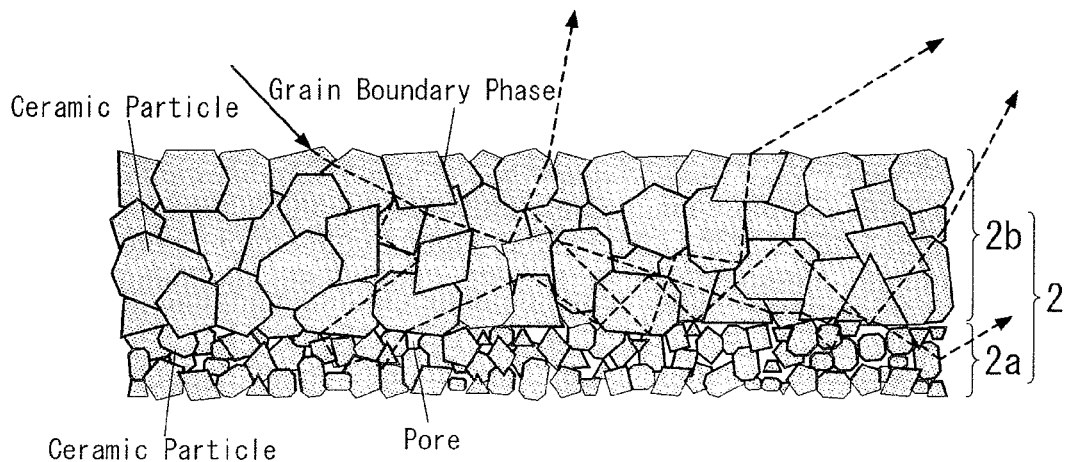
FIGS. 20A to 20C are each an inference mechanism diagram illustrating a principle regarding improvement of the light-outcoupling efficiency of the LED module of the embodiment 3.
Figure 20B:
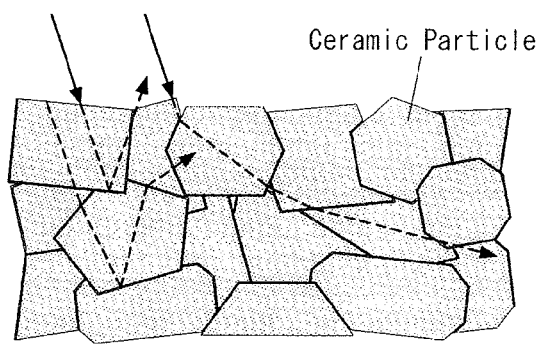

Arrows shown in FIGS. 19, 20A, 20B, and 20C schematically illustrate paths of rays of light emitted from the light emitting layer 43 of the LED chip 4 (see FIG. 2A). Solid-line arrows in FIGS. 19, 20A, and 20B schematically illustrate paths of rays of light which is emitted from the light emitting layer 43 and is reflected by the first surface 2sa of the light-diffusing substrate 2. Further, broken-line arrows in FIGS. 19, 20A, 20B, and 20C schematically illustrate paths of rays of light which is emitted from the light emitting layer 43 and enters the light-diffusing substrate 2.

Figure 20C:
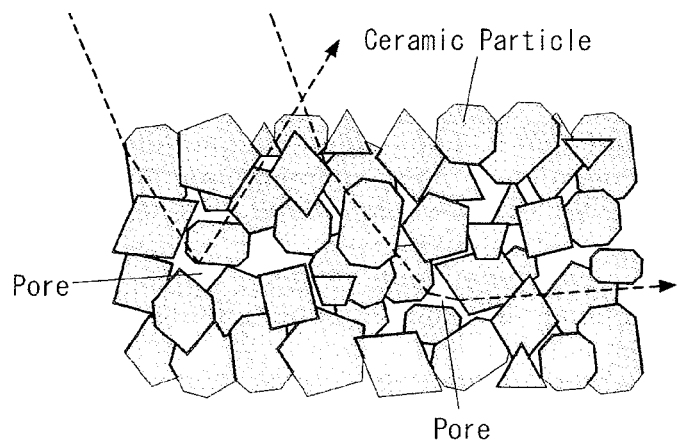

The present inventors inferred that, as shown in FIGS. 19, 20A, and 20B, in the first ceramic layer 2b reflection and refraction occur at the interface between the ceramic particle and the grain boundary phase (glass component is the main component therein) due to a difference between the refractive indices of the ceramic particle and the grain boundary phase. Also, the present inventors inferred that, as shown in FIGS. 19 and 20C, in the second ceramic layer 2a reflection and refraction occur at the interface between the ceramic particle and the pore or the grain boundary phase (glass component is the main component) due to a difference between the refractive indices of the ceramic particle and the pore or the grain boundary phase. Also, the present inventors inferred that, as shown in FIGS. 19 and 20C, in the second ceramic layer 2a reflection and refraction occur at the interface between the pore and the grain boundary phase due to a difference between the refractive indices of the pore and the grain boundary phase. Also, the present inventors inferred that, with respect to ceramic plates, under a condition where the thickness of the ceramic plate is constant, the number of interfaces decrease with an increase in the particle diameter of the ceramic particle, and the probability that light passes through the interface between the ceramic particles and the grain boundary phase while light propagates a unit length, and therefore the reflectance decreases and the transmittance increases.

The present inventors inferred that the light-outcoupling efficiency of the LED module 1 can be improved by increasing, as much as possible, an amount of light which is emitted from the LED chip 4 and passes through the first ceramic layer 2b, and increasing, as much as possible, an amount of light reflected by the second ceramic layer 2a. Therefore, it is preferable that, in the light-diffusing substrate 2, the first ceramic layer 2b includes ceramic particles having a greater particle diameter than ceramic particles of the second ceramic layer 2a. Further, it is preferable that the second ceramic layer 2a include ceramic particles having a smaller particle diameter than the ceramic particles of the first ceramic layer 2b, and the second ceramic layer 2a further include pores.

In the LED module 1 of the present embodiment, the light-diffusing substrate 2 is constituted by the two ceramic layers 2a and 2b stacked in the thickness direction, and therefore the light-outcoupling efficiency can be improved.

In the LED module 1 of the present embodiment, the plurality of ceramic layers (the first ceramic layer 2b and the second ceramic layer 2a) of the light-diffusing substrate 2 are light-transmissive layers having different optical properties.

In summary, the light-diffusing substrate 2 is constituted by the plurality of light-transmissive layers stacked in the thickness direction, and is required to have such a property that optical properties of the plurality of light-transmissive layers differ from each other, and a light-transmissive layer of the plurality of light-transmissive layers which is farther from the LED chip 4 is higher in reflectance for light emitted from the LED chip 4. Hereinafter, the uppermost light-transmissive layer which is the closest to the LED chip 4 may be referred to as a first light-transmissive layer, and the lowermost light-transmissive layer which is farthest from the LED chip 4 may be referred to as a second light-transmissive layer, if needed.

The first light-transmissive layer is preferably composed of material that has a high transmittance with respect to light emitted from the LED chip 4, and has a refractive index close to the refractive index of the LED chip 4. The refractive index of the first light-transmissive layer being close to the refractive index of the LED chip 4 means that the difference between the refractive index of the first light-transmissive layer and the refractive index of a substrate 41 (see FIGS. 2A and 2B) of the LED chip 4 is 0.1 or less, and is more preferably 0. The first light-transmissive layer is preferably composed of material having a high thermal resistance.

The material of the first light-transmissive layer is not limited to ceramics, and may be glass, SiC, GaN, GaP, sapphire, an epoxy resin, a silicone resin, unsaturated polyester, or the like. The material of the ceramics is not limited to $Al_2O_3$, and may be another metal oxide (such as magnesia, zirconia, and titania), a metal nitride (such as aluminum nitride), or the like. As the material of the first light-transmissive layer, ceramics is more preferable than a single crystal from a viewpoint of causing light emitted from the LED chip 4 to be forward-scattered.

The light-transmissive ceramics may be LUMICERA (registered trademark) available from Murata Manufacturing Co., Ltd., HICERAM (product name) available from NGK Insulators, Ltd., or the like. LUMICERA (registered trademark) has a $Ba(Mg,Ta)O_3$-based complex perovskite structure as the main crystal phase. HICERAM is a light-transmissive alumina ceramic.

When the material of the first light-transmissive layer is ceramics, the material preferably includes particles having the particle diameter of around 1 μm to 5 μm.

The first light-transmissive layer may be a single crystal in which voids, a modified portion having a different refractive index, or the like is formed. The voids, the modified portion, or the like may be formed by irradiating, with a laser beam from a femto-second laser, a scheduled formation region of the voids, the modified portion, or the like in the single crystal. The wavelength and the irradiation conditions of the laser beam from the femto-second laser may vary appropriately according to the material of the single crystal, the forming target (void or modified portion), the size of the forming target, or the like. The first light-transmissive layer may be made of a base resin (such as epoxy resin, silicone resin, and unsaturated polyester) (hereinafter, referred to as "first base resin") which contains a filler (hereinafter, referred to as "first filler") having a refractive index different from the base resin. It is more preferable that a difference between the refractive indices of the first filler and the first base resin is small. The first filler preferably has higher thermal conductivity. The first light-transmissive layer preferably has a high density of the first filler, from a viewpoint of increasing thermal conductivity. The shape of the first filler is preferably a sphere, from a viewpoint of suppressing total reflection of incident light. The larger the particle diameter of the first filler, the smaller the reflectivity and the refractivity thereof. The first light-transmissive layer may be configured such that a first filler having a relatively large particle diameter is present in a region of the first light-transmissive layer close to the LED chip 4 in the thickness direction, and a first filler having a relatively small particle diameter is present in a region thereof distant from the LED chip 4. In this case, the first light-transmissive layer may include a plurality of stacked layers having the first fillers with different particle diameters.

It is preferable that a fine recessed and protruded structure for suppressing total reflection of light which is reflected or refracted inside the light-diffusing substrate 2 after emitted from the LED chip 4 towards the light-diffusing substrate 2 be provided to a part which is of the surface of the first light-transmissive layer close to the LED chip 4 (the first face 2sa of the light-diffusing substrate 2) and is a vicinity of a region on which the LED chip 4 is mounted. The recessed and protruded structure may be formed by roughening the surface of the first light-transmissive layer by sandblasting, for example. The surface roughness of the recessed and protruded structure preferably satisfies a condition that an arithmetic average roughness Ra specified in JIS B 0601-2001 (ISO 4287-1997) is around 0.05 μm.

The light-diffusing substrate 2 may have a configuration in which a resin layer having a smaller refractive index than the first light-transmissive layer is formed on a part which is of the surface of the first light-transmissive layer close to the LED chip 4 (the first face 2sa of the light-diffusing substrate 2) and is a vicinity of a region on which the LED chip 4 is mounted. The material of the resin layer may be silicone resin, epoxy resin, or the like. The material of the resin layer may be resin containing phosphor.

The second light-transmissive layer configured to diffusely reflect light emitted from the LED chip 4 is preferred rather than the second light-transmissive layer configured to specularly reflect light emitted from the LED chip 4.

The material of the second light-transmissive layer is not limited to ceramics, and may be glass, SiC, GaN, GaP, sapphire, epoxy resin, silicone resin, unsaturated polyester, or the like. The material of the ceramics is not limited to $Al_2O_3$, and may be another metal oxide (such as magnesia, zirconia, and titania), a metal nitride (such as aluminum nitride), or the like.

When the material of the second light-transmissive layer is ceramics, this material preferably includes particles having the particle diameter of 1 μm or less, and more preferably include particles having the particle diameter of around 0.1 μm to 0.3 μm. Also, the second light-transmissive layer may be the aforementioned porous layer 2a. In a case where the first light-transmissive layer was the first ceramic layer 2b composed of alumina having purity of 99.5%, the bulk density of the first light-transmissive layer was 3.8 to 3.95 g/cm³. In a case where the first light-transmissive layer was the first ceramic layer 2b composed of alumina having purity of 96%, the bulk density of the first light-transmissive layer was 3.7 to 3.8 g/cm³. In contrast, in a case where the second light-transmissive layer was the porous layer 2a, the bulk density of the second light-transmissive layer was 3.7 to 3.8 g/cm³. Note that, the aforementioned bulk density is a value estimated by image processing a SEM image observed and obtained by an SEM.

The second light-transmissive layer may be of a single crystal in which voids, a modified portion having a different refractive index, or the like is formed. The voids, the modified portion, or the like may be formed by irradiating, with a laser beam from a femto-second laser, a scheduled formation region of the voids, the modified portion, or the like in the single crystal. The wavelength and the irradiation conditions of the laser beam from the femto-second laser may vary appropriately according to the material of the single crystal, the forming target (void or modified portion), the size of the forming target, or the like. The second light-transmissive layer may be made of a base resin (such as epoxy resin, silicone resin, unsaturated polyester, and a fluorine resin) (hereinafter, referred to as "second base resin") which contains a filler (hereinafter, referred to as "second filler") having a refractive index different from the base resin. The second light-transmissive layer may be configured such that a second filler having a relatively large particle diameter is present in a region of the second light-transmissive layer close to the LED chip 4 in the thickness direction, and a second filler having a relatively small particle diameter is present in a region thereof distant from the LED chip 4. The material of the second filler is preferably, for example, a white inorganic material, and may be a metal oxide such as $TiO_2$ and ZnO. The particle diameter of the second filler is preferably in a range between around 0.1 μm to 0.3 μm, for example. The filling rate of the second filler is preferably in a range of around 50 to 75 wt %, for example. The silicone resin for the second base resin may be methyl silicone, phenyl silicone, or the like. In a case where the second filler is in a form of solid particle, it is preferable that there is a great difference between the refractive indices of the second filler and the second base resin. A material containing the second base resin and the second filler in the second base resin may be KER-3200-T1 available from Shin-Etsu Chemical Co., Ltd. or the like.

The second filler may be a core-shell particle, hollow particle, or the like. The refractive index of the core of the core-shell particle can be arbitrarily selected, but is preferably smaller than the refractive index of the second base resin. It is preferable that the hollow particle has a smaller refractive index than the second base resin, and that inside of the hollow particle is gas (such as air and inert gas) or vacuum.

The second light-transmissive layer may be a light-diffusion sheet. The light-diffusion sheet may be a white polyethylene terephthalate sheet having a plurality of bubbles, or the like.

The light-diffusing substrate 2 may be formed by, in a case of both the first light-transmissive layer and the second light-transmissive layer being made of ceramics, stacking ceramic green sheets to be the first light-transmissive layer and the second light-transmissive layer individually and sintering the stacked sheets. Note that, in the light-diffusing substrate 2, provided that the second light-transmissive layer includes bubbles, the first light-transmissive layer may include bubbles. In such a case, it is preferable that the first light-transmissive layer is smaller in the number of bubbles and higher in the bulk density than the second light-transmissive layer.

The first light-transmissive layer and the second light-transmissive layer are preferably composed of a material that has a high resistance to light and heat, which are emitted from the LED chip 4 and the phosphor.

The LED module 1 may include a reflection layer over the second surface 2sb of the light-diffusing substrate 2 to reflect light from the LED chip 4 or the like. The reflection layer may be made of silver, aluminum, a silver aluminum alloy, silver alloys other than the silver aluminum alloy, an aluminum alloy, or the like. The reflection layer may be constituted by a thin film, a metal foil, a solder mask (solder), or the like. The reflection layer may be provided on the light-diffusing substrate 2, or may be provided on the mounting substrate 7.

Figure 21:
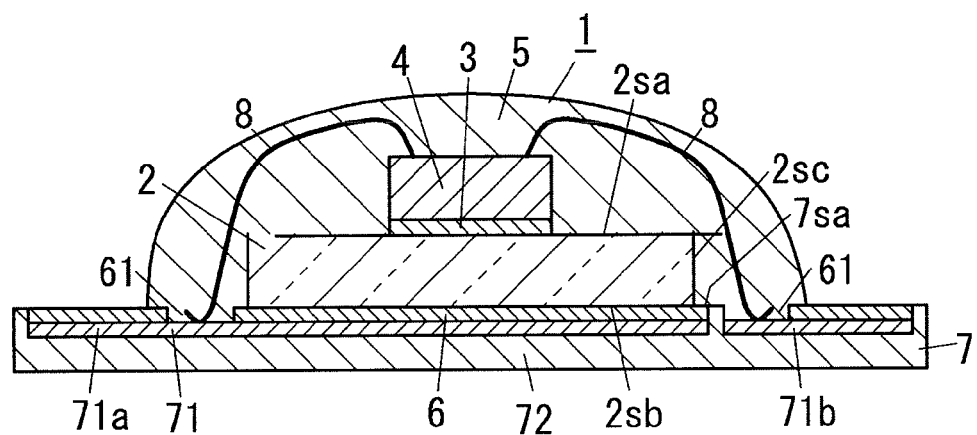
FIG. 21 is a schematic sectional view illustrating the first modification of the LED module of the embodiment 3.

Like the first modification shown in FIG. 21, the color converter 5 of the LED module 1 is formed to cover the LED chip 4, wires 8, and the light-diffusing substrate 2. Thus, in the LED module 1, breakage of the wires 8 can be prevented and therefore the reliability can be improved.

The shape of the color converter 5 is a semispherical shape, but is not limited to and may be a semiellipsoidal shape or a semicylindrical shape.

Figure 22:
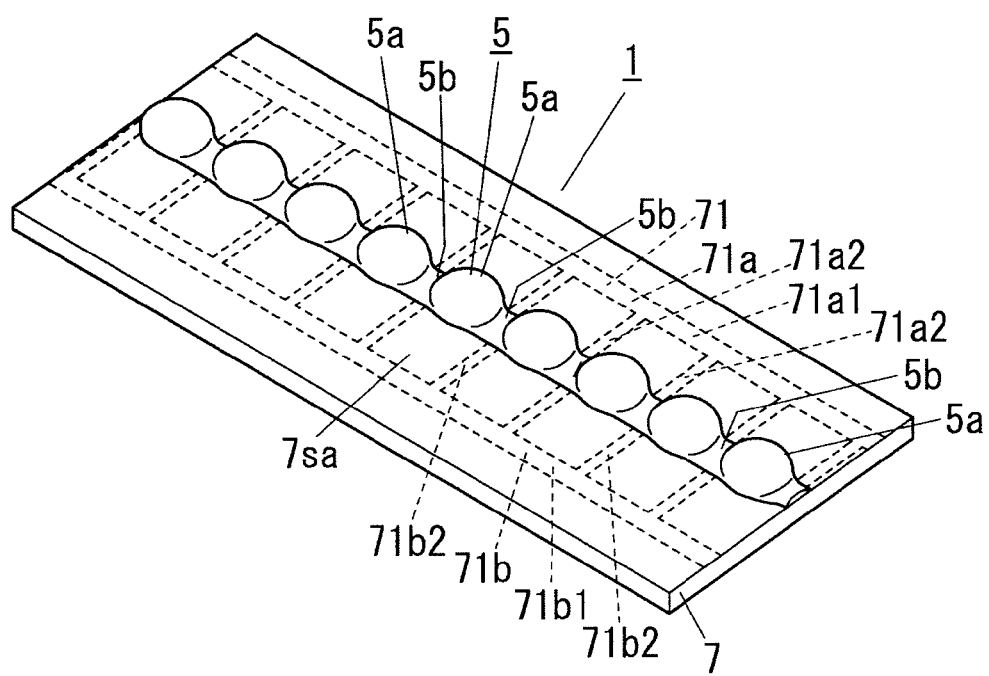
FIG. 22 is a schematic sectional view illustrating the second modification of the LED module of the embodiment 3.

Hereinafter, the second modification of the LED module 1 of the present embodiment is described with reference to FIG. 22.

In the LED module 1 of the second modification, the mounting substrate 7 has an elongated shape, and a plurality of LED chips 4 (see FIG. 21) is included. Note that, the same components of the second modification as the LED module 1 of the first modification are designated by the same reference signs as the first modification so as to avoid the redundant description.

In the LED module 1, the plurality of LED chips 4 are arranged in a prescribed direction on a surface 7sa of the mounting substrate 7. In the LED module 1, the LED chips 4 arranged in the prescribed direction and sets of wires 8 (see FIG. 21) individually connected to the LED chips 4 are covered with the color converter 5 with a linear shape. It is preferable that the color converter 5 includes recesses 5b which are positioned at respective portions between adjacent one of the plurality of LED chips 4 in the prescribed direction and suppress total reflection of light emitted from the adjacent LED chips 4.

One set of a first conductive part 71a and a second conductive part 71b is provided for each group of LED chip 4 arranged in the prescribed direction.

A planar shape of each of the first conductive part 71a and the second conductive part 71b is a comb shape. The first conductive part 71a and the second conductive part 71b are arranged so as to interdigitate in a width direction of the mounting substrate 7. In this regard, in a patterned wiring conductor 71, a first spine 71a1 of the first conductive part 71a and a second spine 71b1 of the second conductive part 71b face each other. In the patterned wiring conductor 71, first teeth 71a2 of the first conductive part 71a and second teeth 71b2 of the second conductive part 71b are arranged alternately at intervals in a lengthwise direction of the mounting substrate 7.

In the LED module 1, the plurality of (e.g., nine) LED chips 4 arranged in the lengthwise direction (the aforementioned prescribed direction) of the mounting substrate 7 are connected in parallel. The LED module 1 is configured to allow supply of electricity to a parallel circuit of the plurality of LED chips 4 connected in parallel. In other words, according to the LED module 1, all the LED chips 4 can be energized by applying a voltage between the first conductive part 71a and the second conductive part 71b. When a plurality of the LED modules 1 are arranged, adjacent LED modules 1 may be electrically connected by conductive members, interconnection wires (not shown), connectors (not shown), or the like. In this case, by supplying electricity from a single power supply unit to the plurality of LED modules 1, all the LED chips 4 of each LED module 1 can be turned on.

The color converter 5 preferably includes, as described above, the recesses 5b which are positioned at respective portions between adjacent one of the plurality of LED chips 4 in the prescribed direction and suppress total reflection of light emitted from the adjacent LED chips 4. Accordingly, in the LED module 1, it is possible to suppress total reflection of light which is emitted from the LED chip 4 and then strikes an interface between the color converter 5 and air. Consequently, in the LED module 1, it is possible to reduce an amount of light which is confined due to total reflection in contrast to a case where the color converter 5 is semicylindrical, and therefore the light-outcoupling efficiency can be improved. In short, in the LED module 1, a total reflection loss can be reduced, and the light-outcoupling efficiency can be improved.

The color converter 5 is formed so as to have a cross section which represents a level difference between the faces of the LED chips 4 and the surface 7sa of the mounting substrate 7. Consequently, a cross section of the color converter 5 perpendicular to the arrangement direction of the LED chips 4 is a protruded shape, and another cross section of the color converter 5 along the arrangement direction of the LED chips 4 is a recessed and protruded shape. In short, in the LED module 1, a recessed and protruded structure causing improvement of the light-outcoupling efficiency is provided to the color converter 5 with a linear shape.

The period of the recessed and protruded structure is the same as the array pitch of the LED chips 4. The period of the recessed and protruded structure is the array pitch of protrusions 5a which cover respective LED chips 4.

The surface shape of the color converter 5 may be designed such that the angle between a light ray from the LED chip 4 and a normal line on the surface of the color converter 5 at a point where the light ray from the LED chip 4 crosses the surface thereof is smaller than the critical angle. Here, in the LED module 1, each of the protrusions 5a of the color converter 5 is preferably designed to have the surface shape such that, in substantially all the areas of the surface of the protrusions 5a of the color converter 5, the incident angle (light incident angle) of the light ray from the LED chip 4 is smaller than the critical angle.

For this reason, in the color converter 5, each of the protrusions 5a which covers a corresponding LED chip 4 is preferably formed in a hemispherical shape. Each protrusion 5a is designed such that the optical axis of the protrusion 5a is aligned with the optical axis of the LED chip 4 covered with the protrusion 5a in the thickness direction of the light-diffusing substrate 2. Accordingly, in the LED module 1, it is possible to suppress not only the total reflection at the surface (interface between the color converter 5 and air) of the color converter 5 but also color unevenness. The color unevenness is a state in which chromaticity varies depending on an irradiation direction of light. In the LED module 1, the color unevenness can be suppressed to such an extent the color unevenness cannot be perceived visually.

In the LED module 1, it is possible to substantially equalize light path lengths of light rays from the LED chip 4 to the surface of the protrusion 5a regardless the emission direction of light from the LED chip 4. As a result, color unevenness can be further suppressed. The shape of each protrusion 5a of the color converter 5 is not limited to hemisphere, and may be a semielliptical shape, for example. Note that, each protrusion 5a may have a semicylindrical shape, a cuboid shape, or the like.

For manufacturing the LED module 1, first, the mounting substrate 7 is prepared. Thereafter, the light-diffusing substrates 2 individually associated with the LED chips 4 are bonded on the mounting substrate 7. After that, the LED chips 4 are die bonded to the first surfaces 2sa of the associated light-diffusing substrates 2 with die bonding apparatus. Subsequently, the first electrodes and the second electrodes of each LED chip 4 are connected to the patterned wiring conductor 71 through the individual wires 8, with wire bonding apparatus or the like. Thereafter, the color converter 5 is formed by use of a dispenser system or the like.

In a process of forming the color converter 5 with a dispenser system, for example, material of the color converter 5 is applied by moving a dispenser head in the arrangement direction of the LED chips 4 while discharging the material from a nozzle of the dispenser head.

In order to apply the material of the color converter 5 with the dispenser system so as to form an application shape corresponding to the surface shape of the color converter 5, the material is discharged and applied while the dispenser head is moved, for example. Specifically, an application amount is varied by varying the moving speed of the dispenser head while the distance between the nozzle and the surface 7sa of the mounting substrate 7 directly under the nozzle is varied by moving the dispenser head up and down. More specifically, the moving speed of the dispenser head is relatively varied in applying the material between in a region to form the protrusion 5a of the color converter 5 and in a region to form a portion of the color converter 5 between adjacent protrusions 5a. The moving speed of the dispenser head is slow in the former region, and the moving speed thereof is fast in the latter region. Moreover, the dispenser head is moved up and down depending on the surface shape of the color converter 5. Accordingly, by the method of forming the color converter 5 with the dispenser system, it is possible to form, with the material, the application shape in accordance with the surface shape of the color converter 5. The application shape may be set in view of contraction in curing the material.

The dispenser system preferably includes: a movement mechanism constituted by a robot for moving the dispenser head; a sensor unit for measuring heights of the surface 7sa of the mounting substrate 7 and the nozzle from a table; and a controller for controlling the movement mechanism and a discharge amount of the material from the nozzle. The controller can be realized, for example, by loading an appropriate program to a microcomputer. The dispenser system can be adapted to various types of products different in the array pitch of the LED chips 4, the number of LED chips 4, the width of the color converter 5, or the like, by changing the program loaded to the controller appropriately.

The surface shape of the color converter 5 can be controlled by adjusting viscosity or the like of the material, for example. The curvature of the surface (convex face) in each of the protrusions 5a can be designed with viscosity and surface tension of the material, a height of the wire 8, or the like. Larger curvature can be realized by increasing the viscosity and the surface tension of the material, or by increasing the height of the wire 8. A smaller width (band width) of the color converter 5 having the band shape can be realized by increasing the viscosity and the surface tension of the material. The viscosity of the material is preferably set to be in a range of around 100 to 2000 mPa·s. Note that, the value of the viscosity may be measured under a room temperature using a cone and plate rotational viscometer, for example.

Further, the dispenser system may include a heater to heat un-cured material so as to adjust viscosity to a desirable value. Accordingly, in the dispenser system, reproducibility of the application shape of the material can be improved, and reproducibility of the surface shape of the color converter 5 can be improved.

The LED module 1 can be used as a light source for various types of lighting devices. Examples of the lighting device including the LED module 1 may include preferable examples including a lighting fixture in which a fixture body holds the LED module 1 as a light source and a lamp (e.g., a straight-tube LED lamp and a bulb type lamp), and other lighting devices. When the fixture body is made of metal and has electrically conductive properties, the LED module 1 includes a resin part 72, and thus it is possible to ensure a desired creepage distance between the patterned wiring conductor 71 and the fixture body. In the lighting fixture, by making the fixture body of metal, heat generated by the LED module 1 can be dissipated efficiently.

The fixture body is preferably made of material having high thermal conductivity, and is more preferably made of material having higher thermal conductivity than the resin part 72. Here, the fixture body is preferably made of metal having high thermal conductivity such as aluminum and copper.

The LED module 1 may be fixed to the fixture body with fixing members such as screws; or bonding the LED module 1 to the fixture body with an epoxy resin layer of a thermoset sheet adhesive in-between. The sheet adhesive may be a sheet adhesive made of a stack of a plastic film (PET film) and a B stage epoxy resin layer (thermoset resin). The B stage epoxy resin layer contains a filling material composed of a filler such as silica and alumina and has a property in which viscosity becomes small and fluidity becomes large when heated. Such a sheet adhesive may be an adhesive sheet TSA available from Toray Industries, Inc. or the like. The filler may be an electrical insulation material having high thermal conductivity than an epoxy resin which is a thermoset resin. The thickness of the aforementioned epoxy resin layer is set to be 100 μm, but this value is an example, and the thickness is not limited thereto, and may be set in a range of around 50 μm to 150 μm as appropriate. The thermal conductivity of the aforementioned epoxy resin layer is preferably larger than 4 W/mK.

The epoxy resin layer which is a sheet adhesive described above has high thermal conductivity, high fluidity when heated, and high adhesiveness to a recessed and protruded surface, along with having an electrical insulation property. Consequently, in the lighting fixture, it is possible to suppress generation of gaps between the aforementioned insulation layer of the epoxy resin layer and the LED module 1 and between the insulation layer and the fixture body, and as a result it is possible to improve adhesion reliability and to suppress an increase of a thermal resistance and occurrence of variation due to lack of adhesion. The insulation layer has an electrical insulation property and thermal conductivity, and has a function of connecting the LED module 1 and the fixture body thermally.

Thus, in the lighting fixture, it is possible to lower a thermal resistance between each LED chip 4 and the fixture body and reduce a variation of thermal resistances, compared with a lighting fixture where a heat dissipation sheet (heat conduction sheet) of a rubber sheet type or a silicone gel type such as Sarcon (registered trademark) is interposed between the LED module 1 and the fixture body 51. Accordingly, in the lighting fixture, the heat dissipation property is improved and therefore an increase in junction temperature of each of the LED chips 4 can be suppressed. Hence, relatively large input power is available and thus the light output can be increased. The thickness of the aforementioned epoxy resin layer is set to 100 µm, but this value is an example, and the thickness is not limited thereto, and may be appropriately set in a range of around 50 µm to 150 µm. The thermal conductivity of the aforementioned epoxy resin layer is preferably larger than 4 W/mK.

Note that, in terms of a general straight-tube LED lamp, "straight-tube LED lamp system with L-type pin cap GX16t-5 (for general illumination)" (JEL 801:2010) is standardized by Japan Electric Lamp Manufacturers Association, for example.

Such a straight-tube LED lamp may include: a tube main body having a straight-tube shape and made of light-transmissive material (e.g., milky white glass and milky white resin); and a first cap and a second cap which are respectively provided at one end and the other end of the tube main body in the lengthwise direction. The LED module 1 in which the mounting substrate 7 has an elongated shape and a plurality of LED chips 4 are arranged in the lengthwise direction of the mounting substrate 7 is accommodated in the tube main body.

Figure 23A:
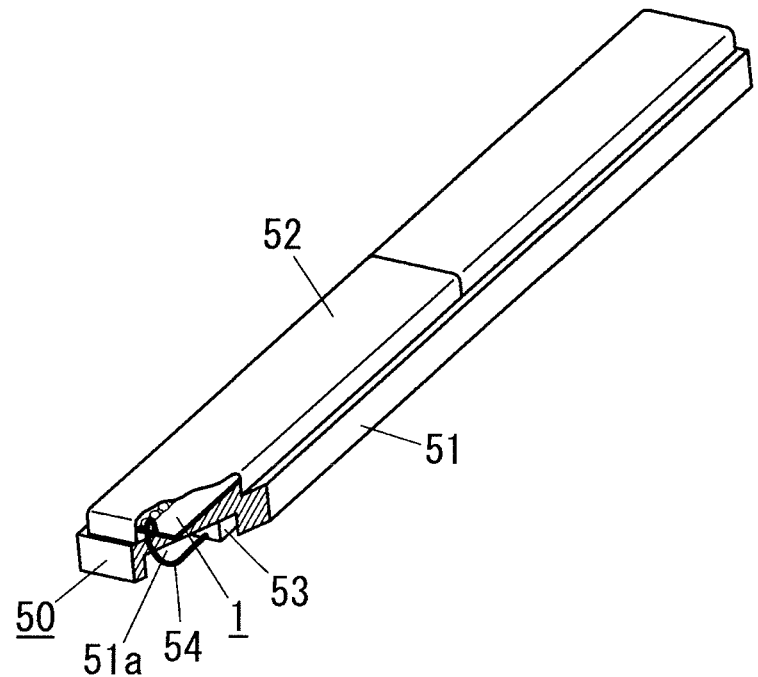
FIG. 23A is a schematic cutaway perspective view illustrating a lighting fixture of the embodiment 3.
Figure 23B:
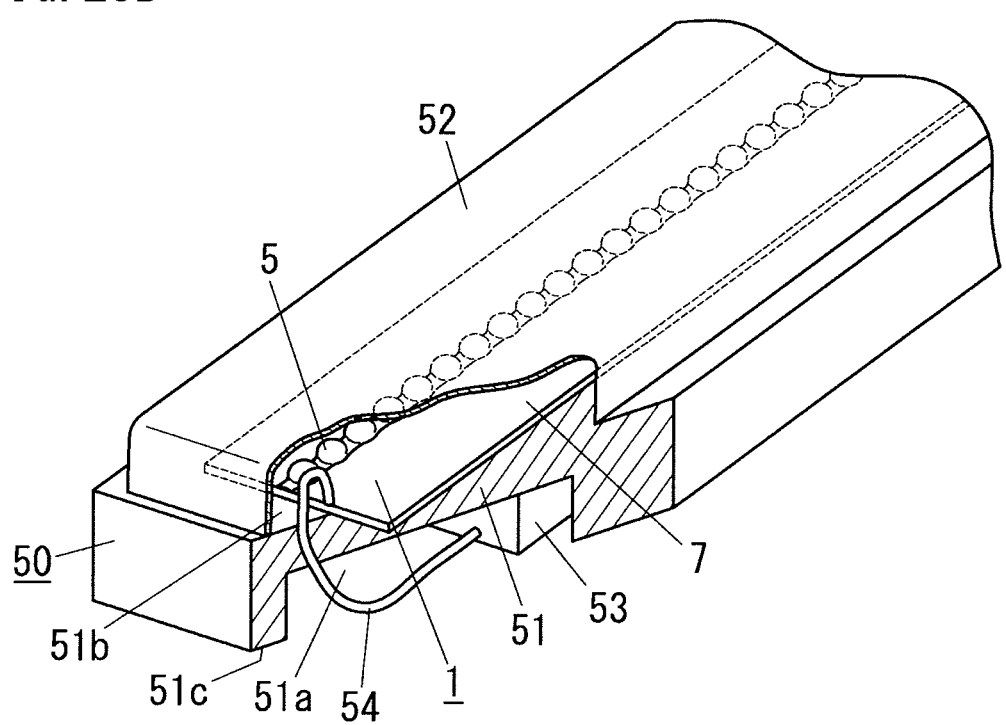
FIG. 23B is an enlarged view illustrating a primary part in FIG. 23A.

Hereinafter, a lighting fixture 50 including the LED module 1 of the second modification as a light source is described with reference to FIGS. 23A and 23B.

The lighting fixture 50 is an LED lighting fixture, and includes the fixture body 51 and the LED module 1 which is used as a light source to be held by the fixture body 51.

The fixture body 51 is formed in an elongated shape (rectangle plate shape, here) and is larger than the LED module 1 in a planar size. In the lighting fixture 50, the LED module 1 is provided on a first surface 51b of the fixture body 51 in the thickness direction. In the lighting fixture 50, the LED module 1 and the fixture body 51 are arranged such that the lengthwise direction of the LED module 1 is aligned with the lengthwise direction of the fixture body 51. The lighting fixture 50 includes a cover 52 for covering the LED module 1 provided on the first surface 51b of the fixture body 51. The cover 52 transmits light which is emitted from the LED module 1.

Further, the lighting fixture 50 includes a lighting device 53 configured to supply DC electricity to the LED module 1 for turning on (lighting) each of the LED chips 4 (see FIG. 21). In the lighting fixture 50, the lighting device 53 and the LED module 1 are electrically interconnected via electric wires 54 e.g., lead wires.

The lighting fixture 50 includes a recessed portion which is to receive the lighting device 53 and is formed in a second surface 51c of the fixture body 51 in the thickness direction of the fixture body 51. The recessed portion 51a is formed along the lengthwise direction of the fixture body 51. Also, the fixture body 51 includes a through hole (not shown) which penetrates a thin portion between the first surface 51b and an inner bottom of the recessed portion 51a so as to allow passage of the wire 54.

In the LED module 1, the wires 54 can be connected to exposed portions of the patterned wiring conductor 71. A connection portion between the patterned wiring conductor 71 and the wire 54 may be a connection portion composed of conductive bonding material such as solder, a connection portion constituted by a male connector and a female connector, or the like.

According to the lighting fixture 50, it is possible to turn on the LED module 1 by supplying DC electricity from the lighting device 53 to the LED module 1. Note that, the lighting device 53 may be a device configured to receive electricity from an AC power supply such as a commercial power supply, or a device configured to receive electricity from a DC power supply such as a solar cell and a storage battery.

The light source of the lighting fixture 50 is not limited to the LED module 1 of the second modification and may be selected from any one of the LED modules 1 of the embodiments 1 to 3 and the first modification of the embodiment 3 and be modified so that the mounting substrate 7 has an elongated shape and a plurality of LED chips 4 are provided to a single mounting substrate 7 like the second modification.

The fixture body 51 is preferably made of material having high thermal conductivity, and is more preferably made of material having higher thermal conductivity than the mounting substrate 7. Here, the fixture body 51 is preferably made of metal having high thermal conductivity such as aluminum and copper. When the fixture body 51 is made of metal, the heat dissipation properties of the lighting fixture 50 can be improved.

The LED module 1 may be fixed to the fixture body 51 with fixing members such as screws; or bonding the LED module 1 to the fixture body 51 with an epoxy resin layer of a thermoset sheet adhesive in-between.

The cover 52 may be made of acrylic resin, polycarbonate resin, silicone resin, glass, or the like.

It is preferable that the cover 52 integrally include a lens portion (not shown) for controlling distribution of light emitted from the LED module 1. In this case, the production cost of the lighting fixture 50 can be reduced compared with a configuration in which a lens prepared separately from the cover 52 is attached to the cover 52.

The lighting fixture 50 described above includes the LED module 1 as the light source, and therefore the production cost thereof can be reduced and the light output thereof can be increased.

Figure 24A:
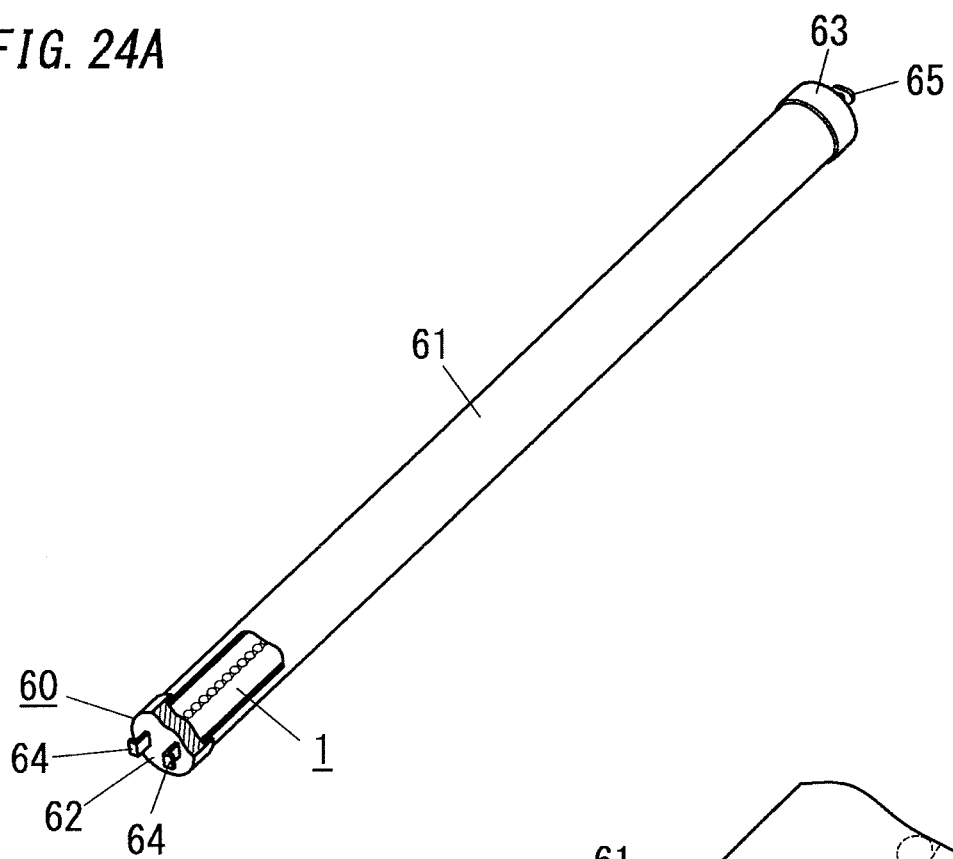
FIG. 24A is a schematic cutaway perspective view illustrating a straight LED lamp of the embodiment 3.
Figure 24B:
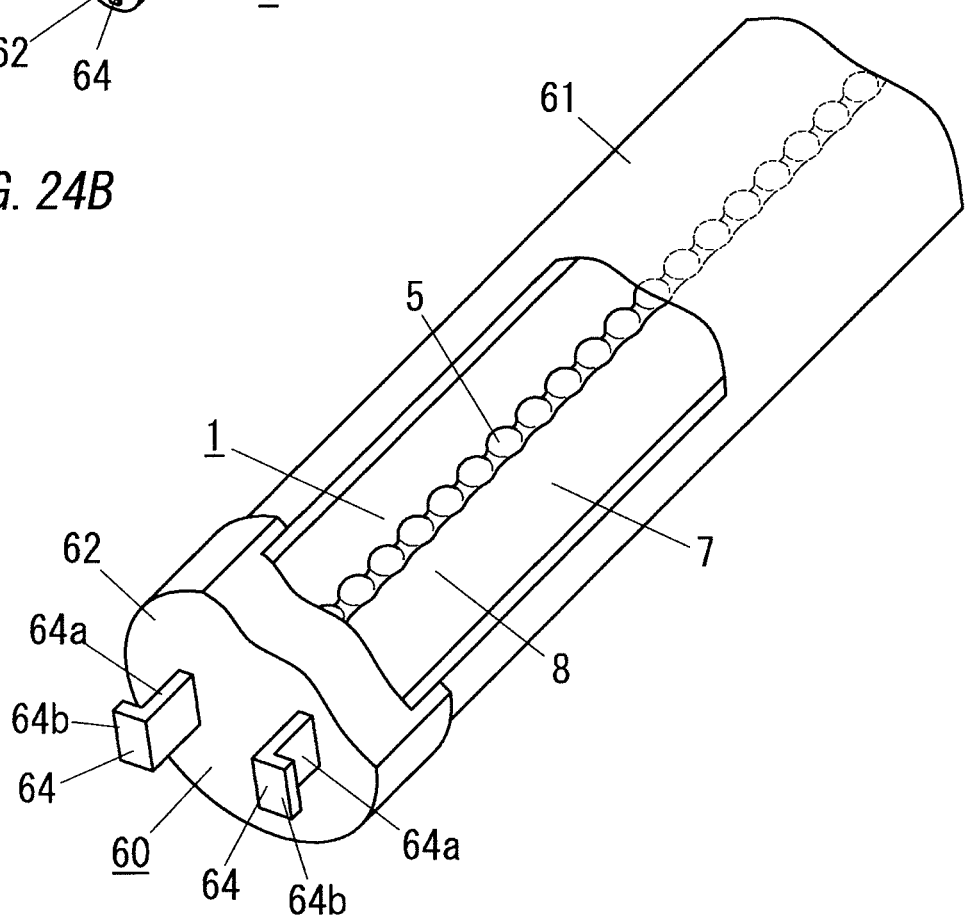
FIG. 24B is an enlarged view illustrating a primary part in FIG. 24A.

Hereinafter, a straight-tube LED lamp 60 including the LED module 1 of the second modification as its light source is described with reference to FIGS. 24A and 24B.

The straight-tube LED lamp 60 includes: a tube body 61 having a straight-tube shape (cylindrical shape) made of light-transmissive material; and a first cap 62 and a second cap 63 that are respectively provided at one end and the other end of the tube body 61 in the lengthwise direction. The LED module 1 of the second modification is housed in the tube body 61. The LED module 1 is not limited to the LED module 1 of the second modification and may be selected from any one of the LED modules 1 of the embodiments 1 to 3 and the first modification of the embodiment 3 and be modified so that the mounting substrate 7 has an elongated shape and a plurality of LED chips 4 are provided to a single mounting substrate 7 like the second modification.

The tube body 61 may be made of transparent glass, milky white glass, a transparent resin, a milky white resin, or the like.

The first cap 62 includes two power supply terminals 64 and 64 (hereinafter referred to as "first lamp pins") which are electrically connected to the LED module 1. These two first lamp pins 64 and 64 are configured to be electrically connected to two power supply contacts respectively of a lamp socket for a power supply which is held by a fixture body of a lighting device (not shown).

The second cap 63 includes one grounding terminal (hereinafter referred to as "second lamp pin") 65 for grounding. This one second lamp pin 65 is configured to be electrically connected to a grounding contact of a lamp socket for grounding which is held by a fixture body.

Each of the first lamp pins 64 is formed in an L-shape, and is constituted by a pin body 64a which protrudes along the lengthwise direction of the tube body 61 and a hook 64b which extends along the radial direction of the tube body 61 from the tip of the pin body 64a. The two hooks 64b extend in directions so as to be away from each other. Note that each of the first lamp pins 64 is formed by bending an elongated metal plate.

The second lamp pin 65 protrudes from an end face (cap reference face) of the second cap 63 in the opposite direction from the tube body 61. Further, the second lamp pin 65 is formed in a T-shape. Note that the straight-tube LED lamp 60 is preferably configured so as to meet the standard of "straight-tube LED lamp system with L-type pin cap GX16t-5 (for general illumination)" (JEL 801:2010) which is standardized by Japan Electric Lamp Manufacturers Association, or the like.

The straight-tube LED lamp 60 as described above includes the aforementioned LED module 1 in the tube body 61, and therefore the light-outcoupling efficiency can be improved and the production cost thereof can be reduced and the light output thereof can be increased.

A lamp which includes the LED module 1 is not limited to the aforementioned straight-tube LED lamp, and may be a straight-tube LED lamp in which the LED module 1 and a lighting device to operate the LED module 1 both are housed in a tube body. Note that, the lighting device receives electricity from an external power supply through lamp pins.

The LED module 1 of the second modification includes the mounting substrate 7 having an elongated shape and a plurality of LED chips 4, but the shape of the mounting substrate 7, the shape of the patterned wiring conductor 71 and the number of LED chips 4 and arrangement of LED chips 4 can be appropriately modified in accordance with the type or the like of the lighting fixture to which the LED module 1 is to be applied.

Figure 25:
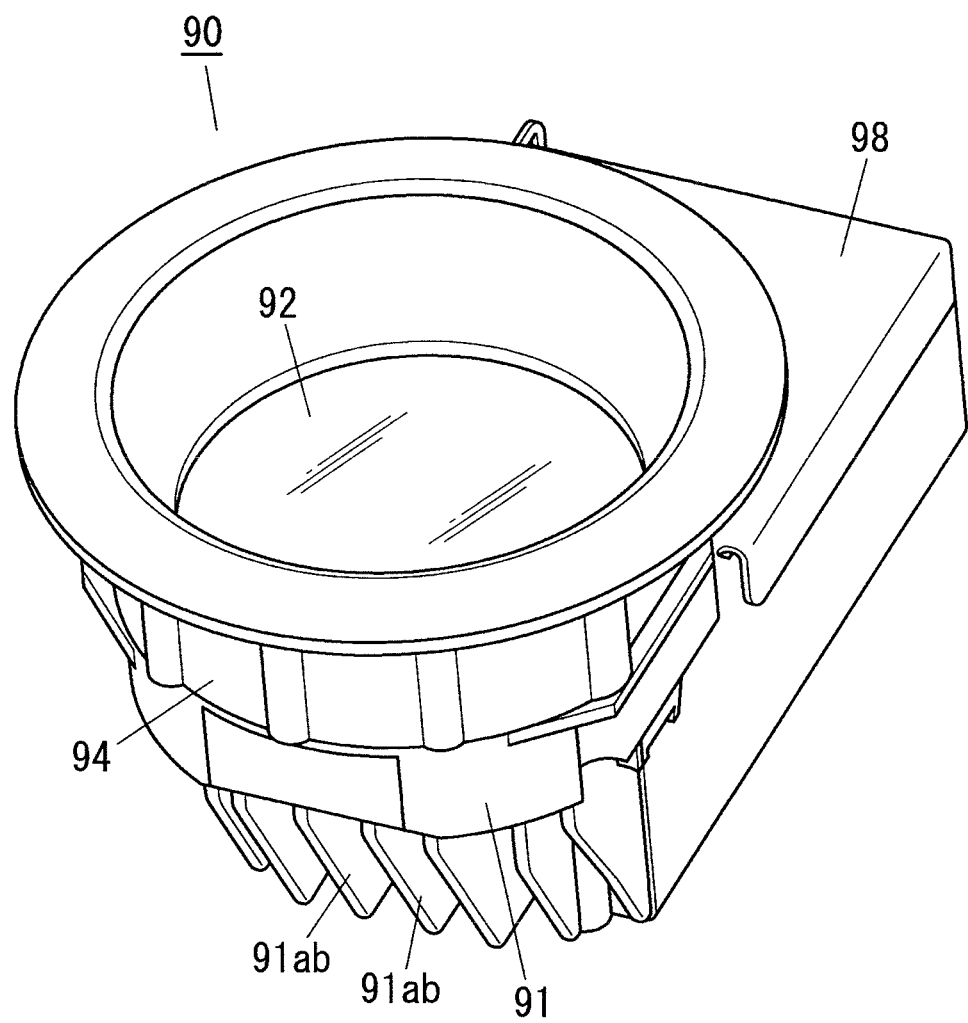
FIG. 25 is a schematic perspective view illustrating the first modification of the lighting fixture of the embodiment 3.
Figure 26:
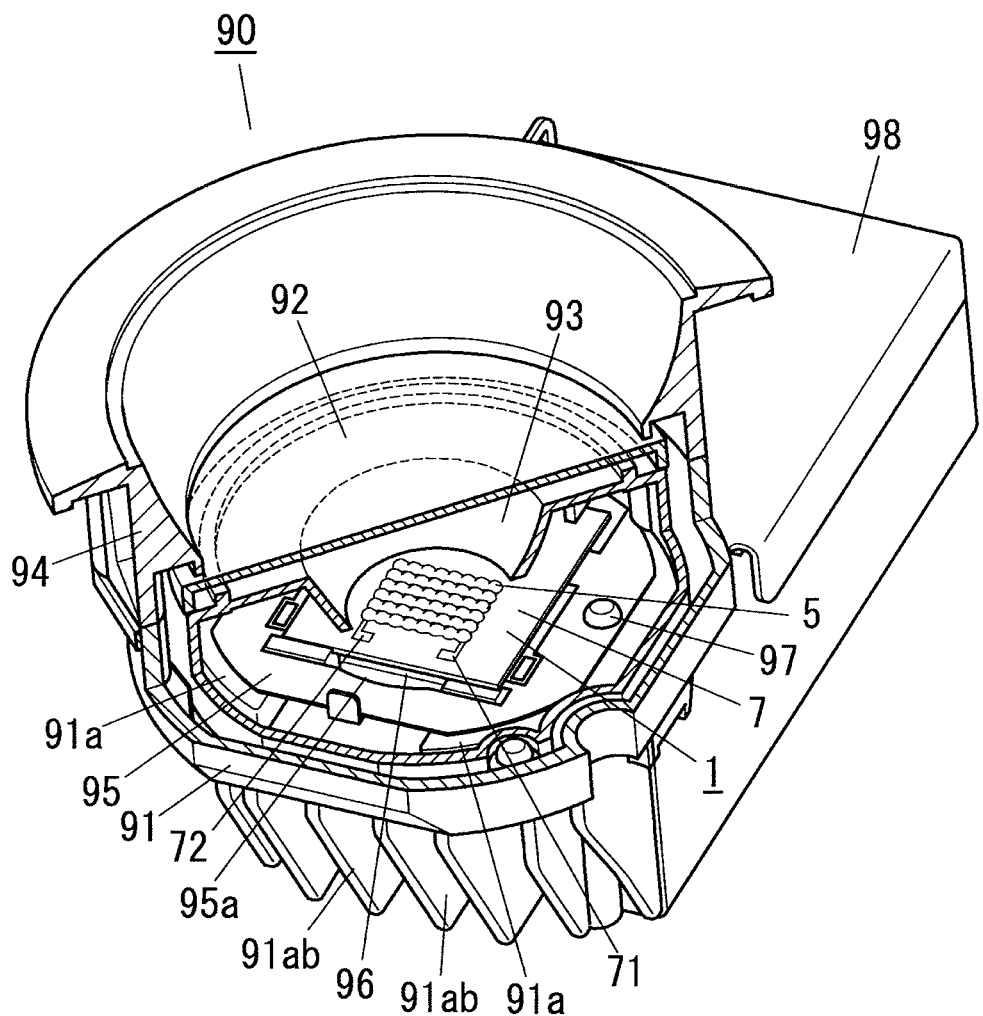
FIG. 26 is a schematic cutaway perspective view illustrating the first modification of the lighting fixture of the embodiment 3.
Figure 27:
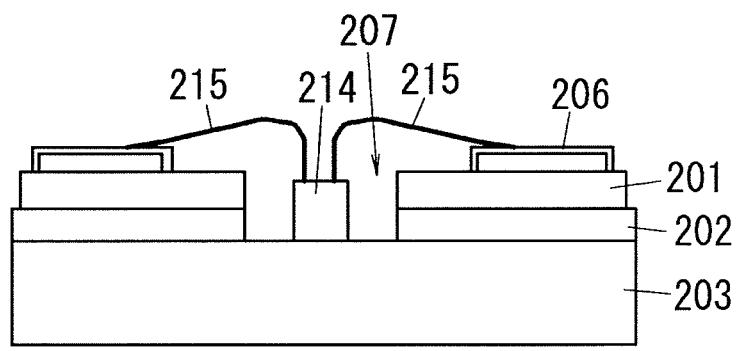
FIG. 27 is a sectional view illustrating a light emitting device of a background art.

Hereinafter, an aspect of a lighting fixture 90 including the LED module 1 is described with reference to FIGS. 25 and 26. Note that the same components of the aspect as the second modification are designated by the same reference signs as the second modification so as to avoid the redundant description.

The lighting fixture 90 is an LED lighting fixture which can be used as a downlight, and includes a fixture body 91a and the LED module 1 which is a light source to be held by the fixture body 91a. Besides, the lighting fixture 90 includes a case 98 which has a rectangular box shape and accommodates a lighting device to operate the LED module 1. The lighting device and the LED module 1 are electrically interconnected by electric wires (not shown) or the like.

In the lighting fixture 90, the fixture body 91 is formed in a disk shape, and the LED module 1 is positioned on a face of the fixture body 91a. Further, the lighting fixture 90 includes a plurality of fins 91ab which protrude from a further face of the fixture body 91. The fixture body 91 is formed integrally with the fins 91ab.

In the LED module 1, the planar shape of the mounting substrate 7 is a square shape, and a plurality of (e.g., forty-eight) of LED chips 4 (see FIG. 21) are arranged in a two dimensional array manner. Further, in the LED module 1, a group (e.g., eight) of LED chips 4 arranged in an imaginary line are connected in series with each other. In the LED module 1, it is assumed that the number of imaginary lines is a predetermined number (e.g., six). The LED module 1 includes the predetermined number of series circuits each constituted by a group of LED chips 4 connected in series with each other. The patterned wiring conductor 71 is designed so that the predetermined number of series circuits are connected in parallel with each other. Note that, the planar shape of the mounting substrate 7 is not limited to a square shape and may be a polygonal shape other than a square shape, a circular shape, or the like, for example. Further, an electrical topology of the plurality of LED chips 4 placed on the surface 7sa of the mounting substrate 7 is not limited particularly. The LED module 1 may include the same number of light-diffusing substrates 2 (see FIG. 21) as the LED chips 4, and one light-diffusing substrate 2 may be provided for each group of LED chips 4.

Moreover, the lighting fixture 90 includes a first reflector 93 to reflect light which is emitted laterally from the LED module 1, a cover 92, and a second reflector 94 to control distribution of light which emerges from the cover 92. Note that, in the lighting fixture 90, the fixture body 91 and the second reflector 94 constitute an outer case to house the LED module 1, the first reflector 93, and the cover 92.

The fixture body 91 includes two pedestals 91a which face each other and are placed on the face. In the lighting fixture 90, a fixing member 95 which has a plate shape and the LED module 1 is to be fixed to is placed on the two pedestals 91a to extend across the gap between the two pedestals 91a. The fixing member 95 is made of a metal plate, and is fixed to each of the pedestals 91a by screws 97. The first reflector 93 is fixed to the fixture body 91. The LED module 1 may be held between the first reflector 93 and the fixing member 95. The first reflector 93 may be made of white synthetic resin.

The fixing member 95 includes an opening 95a exposing part of the mounting substrate 7 of the LED module 1. In the lighting fixture 90, a thermally conductive part 96 is interposed between the mounting substrate 7 and the fixture body 91. The thermally conductive part 96 has a function of transferring heat from the mounting substrate 7 to the fixture body 91. The thermally conductive part 96 is made of thermally conductive grease, but the material thereof is not limited thereto, and may be a thermally conductive sheet.

The thermally conductive sheet may be a silicone gel sheet having electrical insulation and thermal conductivity. The silicone gel sheet used as the thermally conductive sheet is preferably soft. This kind of silicone gel sheet may be Sarcon (registered trademark) or the like.

The material of the thermally conductive sheet is not limited to silicone gel, and may be elastomer, for example, so long as the material has electrical insulation and thermal conductivity.

In the lighting fixture 90, heat generated by the LED module 1 can be efficiently transferred to the fixture body 91 via the thermally conductive part 96. Therefore, in the lighting fixture 90, heat generated by the LED module 1 can be efficiently dissipated via the fixture body 91 and the fins 91ab.

The fixture body 91 and the fins 91ab are preferably made of material having high thermal conductivity, and more preferably made of material having higher thermal conductivity than the mounting substrate 7. In this regard, the fixture body 91 and the fins 91ab are preferably made of metal having high thermal conductivity such as aluminum and copper.

The cover 92 may be made of acrylic resin, polycarbonate resin, silicone resin, glass, or the like.

The cover 92 may be formed integrally with a lens part (not shown) for controlling distribution of light emitted from the LED module 1.

The second reflector 94 may be made of aluminum, stainless steel, resin, ceramics, or the like.

The lighting fixture 90 described above includes the aforementioned LED module 1 as its light source, and therefore the production cost can be reduced and the light output can be increased. Besides, in the lighting fixture 90, the fixture body 91 may serve as the mounting substrate 7 of the LED module 1.

The invention claimed is:

1. An LED module comprising:
a light-diffusing substrate having light-transmissive properties;
at least one LED chip bonded to a first surface of the light-diffusing substrate with a transparent first bond in-between;
a color converter facing the first surface to cover the at least one LED chip; and
a mounting substrate,
the color converter comprising a transparent material containing phosphor which, when excited by light emitted from the at least one LED chip, emits light having a different color from the at least one LED chip, and
a diffuse reflection layer diffusely reflecting light emitted from the at least one LED chip and light emitted from the phosphor, and the diffuse reflection layer being positioned facing a second surface of the light-diffusing substrate, wherein:
the light-diffusing substrate includes a first ceramic layer on top of a porous layer comprising a ceramic and a glass component, and the light-diffusing substrate includes a surface and an interior and has a planar size greater than a planar size of the at least one LED chip, and
a plurality of rays of light emitted from the at least one LED chip toward the light-diffusing substrate are diffused by the interior of the light-diffusing substrate and emerge outside through a peripheral part of the first surface of the light-diffusing substrate.

2. The LED module of claim 1, wherein:
the at least one LED chip includes a face in a thickness direction and a first electrode and a second electrode which are connected to the face;
the mounting substrate includes a patterned wiring conductor electrically connected to the first electrode and the second electrode of the at least one LED chip through respective wires, and a resin part placed facing a rear face of the patterned wiring conductor;
the patterned wiring conductor is opaque;
the resin part has electrically-insulating properties;
the diffuse reflection layer faces a front face of the patterned wiring conductor;
the diffuse reflection layer includes through holes allowing passage of respective second ends of the wires having first ends respectively bonded to the first electrode and the second electrode.

3. The LED module of claim 2, wherein the patterned wiring conductor covers most of a surface of the resin part close to the light-diffusing substrate; and
the diffuse reflection layer covers most of the patterned wiring conductor in a plan view.

4. The LED module of claim 1, wherein:
the at least one LED chip includes a face in a thickness direction and a first electrode and a second electrode which are connected to the face;
the mounting substrate includes a patterned wiring conductor electrically connected to the first electrode and the second electrode of the at least one LED chip through respective wires, and a resin part placed facing a rear face of the patterned wiring conductor;
the patterned wiring conductor is opaque;
the resin part has electrically-insulating properties; and
the diffuse reflection layer faces the second surface of the light-diffusing substrate, and an opposite side of the diffuse reflection layer from the light-diffusing substrate is bonded to a front face of the patterned wiring conductor by a transparent second bond.

* * * * *